(12) United States Patent
Kubo et al.

(10) Patent No.: US 8,411,438 B2
(45) Date of Patent: Apr. 2, 2013

(54) HEAT SINK FOR POWER MODULE

(75) Inventors: Hidehito Kubo, Kariya (JP); Masahiko Kimbara, Okazaki (JP); Keiji Toh, Kariya (JP); Kota Otoshi, Kariya (JP); Eiji Kono, Kariya (JP); Katsufumi Tanaka, Kariya (JP); Nobuhiro Wakabayashi, Oyama (JP); Shintaro Nakagawa, Oyama (JP); Yuichi Furukawa, Oyama (JP); Shinobu Yamauchi, Oyama (JP)

(73) Assignees: Kabushiki Kaisha Toyota Jidoshokki, Aichi-ken (JP); Showa Denko K.K., Tokyo (JP)

( * ) Notice: Subject to any disclaimer, the term of this patent is extended or adjusted under 35 U.S.C. 154(b) by 710 days.

(21) Appl. No.: 11/922,945

(22) PCT Filed: Jun. 27, 2006

(86) PCT No.: PCT/JP2006/312787
§ 371 (c)(1),
(2), (4) Date: Apr. 13, 2009

(87) PCT Pub. No.: WO2007/000991
PCT Pub. Date: Jan. 4, 2007

(65) Prior Publication Data
US 2009/0302458 A1    Dec. 10, 2009

(30) Foreign Application Priority Data

Jun. 27, 2005 (JP) ................. 2005-186077

(51) Int. Cl.
*H05K 7/20* (2006.01)

(52) U.S. Cl. ....... 361/699; 361/689; 361/704; 165/80.4; 165/152

(58) Field of Classification Search .......... 361/699, 361/701–704, 717–718; 165/80.2–80.5, 165/104.33, 109.1, 152, 185
See application file for complete search history.

(56) References Cited

U.S. PATENT DOCUMENTS 1,416,570 A    5/1922  Modine
(Continued)

FOREIGN PATENT DOCUMENTS

DE    198 06 978 A1    8/1999
FR    472122    11/1914
(Continued)

OTHER PUBLICATIONS

PCT International Search Report (PCT/2006/312787) mailed Oct. 3, 2006.

(Continued)

*Primary Examiner* — Boris Chervinsky
(74) *Attorney, Agent, or Firm* — Locke Lord LLP

(57) ABSTRACT

A heat sink (1) for power module is capable of mounting a power device (101) on at least a surface of the heat sink. The heat sink includes a refrigerant passage (1d) in which cooling medium that dissipates heat generated by the power device (101) flows and a corrugated fin body (1a) arranged in the refrigerant passage (1d). The corrugated fin body (1a) has crests (21b) and troughs (21c) that extend in the flow direction of the cooling medium, and side walls (21a) each of which connects the corresponding one of the crests (21b) with the adjacent one of the troughs (21c). Each adjacent pair of the side walls (21a) and the corresponding one of the crests (21b) or the corresponding one of the troughs (21c) arranged between the adjacent side walls (21a) form a fin (21). Each of the side walls (21a) has a louver (31) that operates to, at least, rotate the cooling medium flowing in the associated fin (21). The heat sink (1) thus has a further improved heat dissipating performance.

6 Claims, 20 Drawing Sheets

U.S. PATENT DOCUMENTS

| | | | |
|---|---|---|---|
| 3,003,749 A | 10/1961 | Morse | |
| 3,265,127 A | 8/1966 | Nickol et al. | |
| 5,586,598 A | 12/1996 | Tanaka et al. | 165/133 |
| 5,653,285 A | 8/1997 | Lee | |
| 6,073,686 A * | 6/2000 | Park et al. | 165/144 |
| 6,161,610 A | 12/2000 | Azar | |
| 6,170,566 B1 * | 1/2001 | Blumel et al. | 165/152 |
| 6,263,955 B1 * | 7/2001 | Azar | 165/80.3 |
| 6,324,061 B1 | 11/2001 | Kinoshita et al. | |
| 6,615,910 B1 * | 9/2003 | Joshi et al. | 165/80.3 |
| 6,672,376 B2 * | 1/2004 | Shembekar et al. | 165/152 |
| 6,729,388 B2 * | 5/2004 | Emrich et al. | 165/153 |
| 6,942,024 B2 * | 9/2005 | Nies | 165/152 |
| 7,059,397 B2 * | 6/2006 | Chatel et al. | 165/166 |
| 2002/0056544 A1 | 5/2002 | Azar | |
| 2003/0150597 A1 | 8/2003 | Lin et al. | |
| 2004/0022029 A1 | 2/2004 | Nagatomo et al. | 361/709 |
| 2004/0031587 A1 | 2/2004 | Fong | |
| 2006/0016582 A1 * | 1/2006 | Hashimoto et al. | 165/109.1 |
| 2007/0051503 A1 * | 3/2007 | Grajzl | 165/152 |

FOREIGN PATENT DOCUMENTS

| | | | |
|---|---|---|---|
| JP | 01-098896 | | 4/1989 |
| JP | 06-023257 | | 3/1994 |
| JP | 07-180984 | | 7/1995 |
| JP | 11261266 A | * | 9/1999 |
| JP | 2002-005591 A | | 1/2002 |
| JP | 2002-016201 | | 1/2002 |
| JP | 2002299871 A | * | 10/2002 |
| JP | 2003-086744 | | 3/2003 |
| JP | 2003-222288 | | 8/2003 |
| JP | 2004-266973 | | 9/2004 |
| JP | 2005-069571 | | 3/2005 |

OTHER PUBLICATIONS

English translation of the International Preliminary Report on Patentability dated Jan. 17, 2008, Application No. PCT/JP2006/312787.

Office Action for Application No. 06 767 404.4-1235, dated Jun. 14, 2010.

Supplementary European Search Report for Application No. 06767404.4-1235/1898464, dated Aug. 3, 2009.

* cited by examiner

HEAT SINK FOR POWER MODULE

TECHNICAL FIELD OF THE INVENTION

The present invention relates to a heat sink for power module.

BACKGROUND OF THE INVENTION

A conventional heat sink for power module is disclosed in, for example, Patent Document 1. The heat sink for power module is made of aluminum or copper (the "aluminum" herein includes aluminum alloy other than pure aluminum and the "copper" includes copper alloy other than pure copper). A refrigerant passage in which cooling medium such as water flows is defined in the heat sink for power module. More specifically, the heat sink for power module has a laterally elongated rectangular cross section. In the heat sink, the refrigerant passage having a laterally elongated rectangular cross section is provided. Fins extending in an up-and-down direction are arranged in the refrigerant passage and increase the contact area with respect to the cooling medium.

An insulated circuit substrate on which power devices such as semiconductor chips are mounted is arranged at one surface of the heat sink for power module. Before the power devices are mounted, the structure is referred to as a substrate for power module including a heat sink for power module and an insulated circuit substrate.

The insulated circuit substrate includes, for example, a wiring layer formed of aluminum, an insulated substrate that is formed of insulating ceramic and joined to the wiring layer, and a heat radiating layer that is formed of aluminum and joined to the insulated substrate. When the substrate for power module is used, power devices such as semiconductor chips are mounted on the wiring layer. A heat radiating plate that is formed of aluminum and sized at 3 to 10 mm is provided between the insulated circuit substrate and the heat sink for power module.

The conventional heat sink for power module, which is configured as above-described, forms a power module when an insulated circuit substrate on which power devices such as semiconductor chips are mounted is provided at one surface of the heat sink. The power module may be used in an inverter circuit of a movable body such as a hybrid vehicle, which employs an electric motor as one of its drive sources. In this case, the power module adjusts the power supplied to the electric motor or the like in correspondence with the operating state of the movable body. The power module transmits intense heat generated by the power devices to the heat sink for power module through the wiring layer, the insulated substrate, the heat radiating layer, and the heat radiating plate. The heat is then dissipated by the cooling medium flowing in the refrigerant passage.

However, the conventional heat sink for power module has the following problem with regard to the efficiency of transmission of the intense heat generated by the power devices to the cooling medium, which flows in the refrigerant passage, from the refrigerant passage or the surfaces of the fins.

Specifically, in the above-described conventional heat sink for power module, the fins that extend in the up-and-down direction are provided in the refrigerant passage in order to increase the contact area with respect to the cooling medium. However, regardless of the fins, the temperature of the cooling medium becomes higher toward the area thermally closer to the power devices. The distribution of the temperature of the cooling medium in the heat sink for power module thus becomes nonuniform. This limits effective cooling performance of the cooling medium to a certain level and lowers the heat dissipating efficiency. As a result, in the heat sink for power module, transmission of the heat from the inner surfaces of the refrigerant passage or the surfaces of the fins to the cooling medium is hampered. This makes it difficult to further improve the heat dissipating performance.

Patent Document 1: Japanese Laid-Open Patent Publication No. 2003-86744

DISCLOSURE OF THE INVENTION

Accordingly, it is an objective of the present invention to provide a heat sink for power module that is capable of further improving heat dissipating performance.

In accordance with a first invention of the present application, there is provided a heat sink for power module, the heat sink being capable of mounting a power device on at least one surface of the heat sink. The heat sink includes a refrigerant passage in which a cooling medium that dissipates heat generated by the power device flows and a corrugated fin body arranged in the refrigerant passage. The corrugated fin body has crests and troughs that extend in a flow direction of the cooling medium and side walls each of which connects the corresponding one of the crests with the adjacent one of the troughs. Each adjacent pair of the side walls and the corresponding one of the crests or the corresponding one of the troughs arranged between the adjacent side walls form a fin. Each of the side walls has a louver that operates to, at least, rotate the cooling medium flowing in the associated fin. As long as the louver at least rotates the cooling medium, the louver may cause local turbulence. The body of the heat sink that defines the refrigerant passage may be formed of aluminum or copper. The corrugated fin body may also be formed of aluminum or copper.

Japanese Laid-Open Patent Publication No. 2002-5591 discloses a heat sink for power module having a louver formed in a fin. However, the fin does not rotate the cooling medium but simply causes turbulence, which may lead to erosion. Contrastingly, the heat sink for power module according to the first invention rotates the cooling medium by means of the louver. This prevents erosion and improves the durability.

In the first invention, the corrugated fin body may form a rectangular wave shape. However, if the top surface of each crest and the bottom surface of each trough are flat surfaces extending perpendicular to the side walls, the cooling medium is easily stopped at the portions corresponding to the crests and the troughs. It is thus preferred that the top surface of each crest and the bottom surface of each trough be curved.

In accordance with a second invention of the present application, there is provided a heat sink for power module, the heat sink being capable of mounting a power device on at least one surface of the heat sink. The heat sink includes a refrigerant passage in which a cooling medium that dissipates heat generated by the power device flows and a corrugated fin body arranged in the refrigerant passage. The corrugated fin body has crests and troughs that extend in a flow direction of the cooling medium and side walls each of which connects the corresponding one of the crests with the adjacent one of the troughs. Each adjacent pair of the side walls and the corresponding one of the crests or the corresponding one of the troughs arranged between the adjacent side walls form a fin. A guide that extends in the flow direction of the cooling medium and operates to stir the cooling medium is arranged in each of the fins.

In the second invention, the body of the heat sink defining the refrigerant passage may be formed of aluminum or copper. The guide may also be formed of aluminum or copper. The guide may be formed by a wire or a belt-like member. Guides may be arranged in the fin. The guide according to the second invention extends in the flow direction of the cooling medium. In this regard, the concept of the guide is different from that of an exchange device according to sixth invention, which will be explained later.

To stir herein includes to rotate and to cause turbulence.

Also in the second invention, the corrugated fin body may form a rectangular wave. However, if the top surface of each crest and the bottom surface of each trough are flat surfaces extending perpendicular to the side walls, the cooling medium is easily stopped at the portions corresponding to the crests and the troughs. It is thus preferred that the top surface of each crest and the bottom surface of each trough be curved.

In accordance with a third invention of the present application, there is provided a heat sink for power module, the heat sink being capable of mounting a power device on at least one surface of the heat sink. The heat sink includes a refrigerant passage in which a cooling medium that dissipates heat generated by the power device flows and a guide member arranged in the refrigerant passage. The guide member has a first guide plate and a second guide plate. The first guide plate is formed by a corrugated fin body including crests and troughs that are alternately arranged, and side walls each of which connects the corresponding one of the crests with the adjacent one of the troughs. Each adjacent pair of the side walls and the corresponding one of the crests or the corresponding one of the troughs arranged between the adjacent side walls form a first fin. The first fin operates to guide the cooling medium in a direction inclined at a first angle with respect to a flow direction of the cooling medium. The second guide plate is formed by a corrugated fin body including crests and troughs that are alternately arranged, and side walls each of which connects the corresponding one of the crests with the adjacent one of the troughs. Each adjacent pair of the side walls and the corresponding one of the crests or the corresponding one of the troughs arranged between the adjacent side walls form a second fin. The second fin operates to guide the cooling medium in a direction inclined at a second angle, which is different from the first angle, with respect to the flow direction of the cooling medium.

In the third invention, the body of the heat sink that defines the refrigerant passage may be formed of aluminum or copper. Also, the corrugated fin body may be formed of aluminum or copper.

Also in the third invention, the corrugated fin body may form a rectangular wave. However, if the top surface of each crest and the bottom surface of each trough are flat surfaces extending perpendicular to the side walls, the cooling medium is easily stopped at the portions corresponding to the crests and the troughs. It is thus preferred that the top surface of each crest and the bottom surface of each trough be curved.

In accordance with a fourth invention of the present application, there is provided a heat sink for power module, the heat sink being capable of mounting a power device on at least one surface of the heat sink. The heat sink includes a refrigerant passage in which a cooling medium that dissipates heat generated by the power device flows and a comb tooth member arranged in the refrigerant passage. The comb tooth member has a substrate extending parallel with the surface on which the power device is arranged and a plurality of upright walls that project from the substrate in a direction crossing the surface on which the power device is arranged. Each of the upright walls extends along a flow direction of the cooling medium in the refrigerant passage. Each upright wall has a guide portion that operates to stir the cooling medium flowing between the upright wall and the adjacent one of the upright walls.

In the fourth invention, the body of the heat sink defining the refrigerant passage may be formed of aluminum or copper. The comb tooth member may also be formed of aluminum or copper.

In accordance with a fifth invention of the present application, there is provided a heat sink for power module, the heat sink being capable of mounting a power device on at least one surface of the heat sink. The heat sink includes a laminated body including a plurality of passage plates that are joined together and a plurality of parallel grooves that are arranged between each adjacent pair of the passage plates. Each of the grooves functions as a refrigerant passage in which a cooling medium that dissipates heat generated by the power device flows. Each of the passage plates includes a guide portion operating to stir the cooling medium flowing in the corresponding groove.

In the fifth invention, each passage plate may be formed of metal such as aluminum or copper, or ceramic such as aluminum nitride.

In accordance with a sixth invention of the present application, there is provided a heat sink for power module, the heat sink being capable of mounting a power device on at least one surface of the heat sink. The heat sink includes a refrigerant passage in which a cooling medium that dissipates heat generated by the power device flows and an exchange device arranged in the refrigerant passage. The exchange device moves the cooling medium from an area of the refrigerant passage close to the surface on which the power device is provided to an area of the refrigerant passage far from the surface on which the power device is provided, and from the area of the refrigerant passage far from the surface on which the power device is provided to the area of the refrigerant passage close to the surface on which the power device is provided.

The exchange device according to the sixth invention does not necessarily have to extend in the flow direction of the cooling medium or stir the cooling medium by causing a rotating flow or turbulence. In this regard, the concept of the exchange device is different from that of the guide according to the second invention.

In the sixth invention, the body of the heat sink that defines the refrigerant passage may be formed of aluminum or copper. The stirring device may also be formed of aluminum or copper.

DETAILED DESCRIPTION OF THE PREFERRED EMBODIMENTS

First to nineteenth embodiments of first to sixth inventions of the present application will now be described with reference to the attached drawings. In each of the drawings, an upper side corresponds to a surface and a lower side corresponds to a backside.

First Embodiment

A first embodiment corresponds to the first invention.

Figure 2:
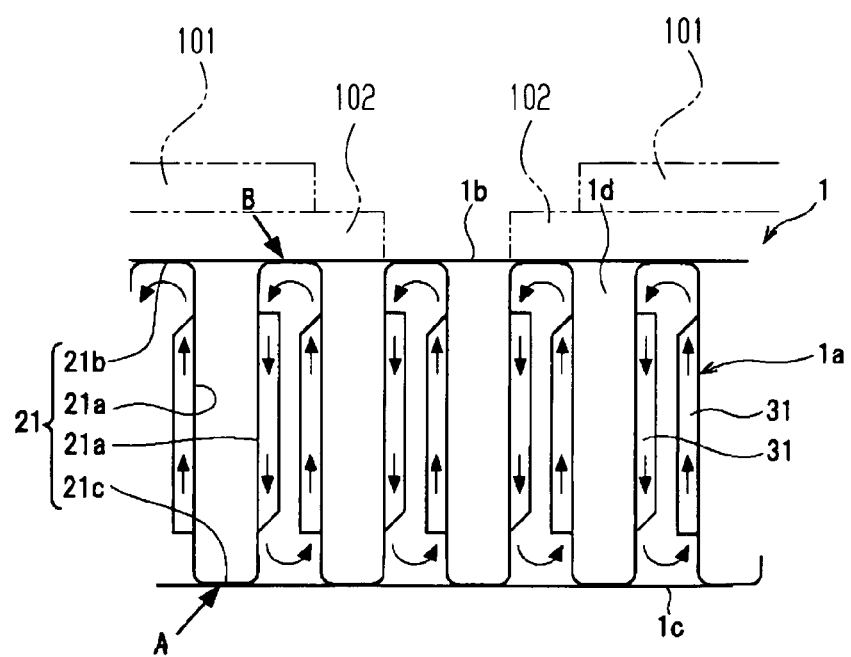
FIG. 2 is a cross-sectional view schematically showing the heat sink for power module according to the first embodiment.

Power devices 101 may be mounted on a surface of a heat sink 1 for power module according to the first embodiment, which is shown in FIG. 2. The heat sink 1 has a refrigerant passage 1d in which cooling medium for dissipating heat generated by the power devices 101 flows.

The refrigerant passage 1d of the heat sink 1 for power module is a space with a rectangular cross section surrounded by a surface 1b, a backside 1c, and side surfaces (not shown), which are provided at opposing sides. The cooling medium flows from the side closer to the viewer of FIG. 2 toward the side farther from the viewer of the drawing.

Figure 1:
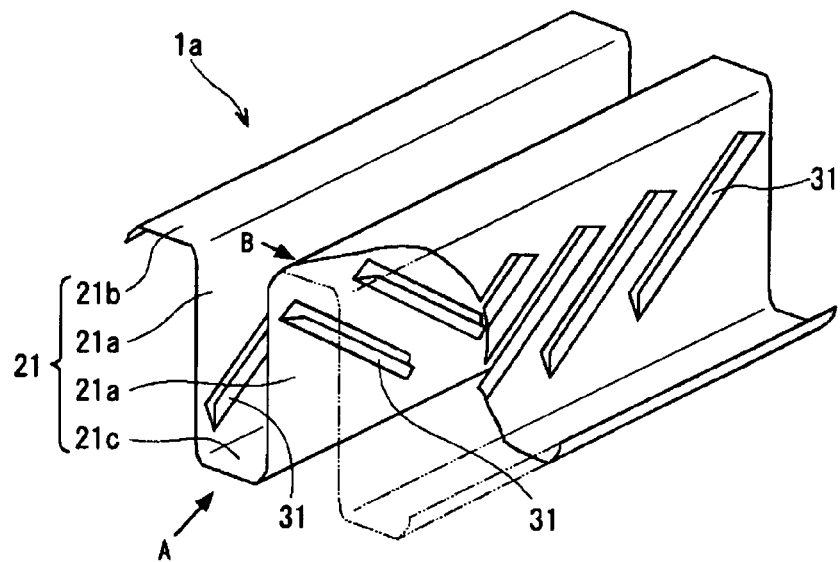
FIG. 1 is a perspective view schematically showing a corrugated fin body of a heat sink for power module according to a first embodiment.

As shown in FIGS. 1 and 2, a corrugated fin body 1a is arranged in the refrigerant passage 1d. The corrugated fin body 1a has crests 21b and troughs 21c, which extend in the flow direction of the cooling medium, and side walls 21a. The crests 21b and the troughs 21c are alternately provided in a direction perpendicular to the flow direction of the cooling medium. Each of the side walls 21a connects the corresponding one of the crests 21b with the adjacent one of the troughs 21c. Each adjacent pair of the side walls 21a and the associated one of the crests 21b, which is located between the side walls 21a, form a fin 21.

Each of the side walls 21a has louvers 31, which operate to, at least, rotate the cooling medium flowing in the associated one of the fins 21. The louvers 31 are formed simultaneously with the corrugated fin body 1a.

Figure 3:
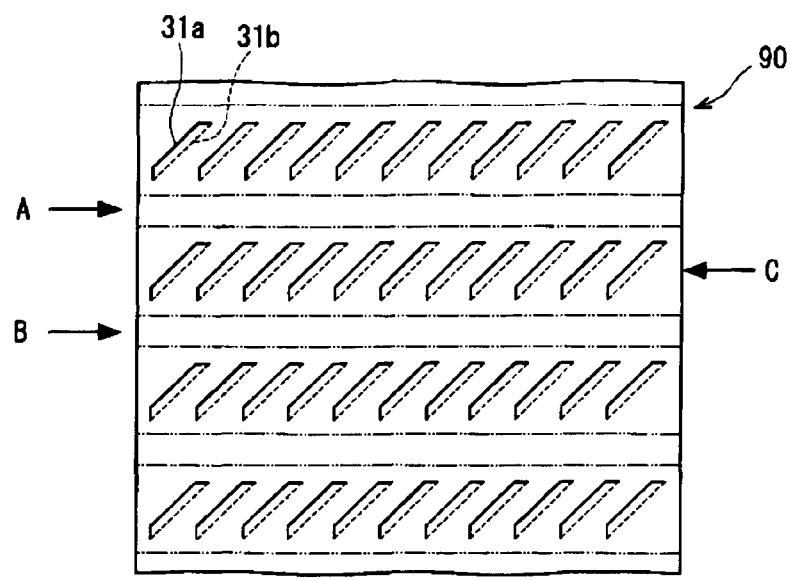
FIG. 3 is a top view schematically showing a thin aluminum plate for forming the corrugated fin body of the heat sink for power module according to the first embodiment.

Specifically, the corrugated fin body 1a is manufactured using a thin aluminum plate 90 shown in FIG. 3. The thin aluminum plate 90 has belt-like sections A that form the troughs 21c after bending, belt-like sections B that extend parallel with the belt-like sections A and are form the crests 21b after bending, and belt-like sections C that are arranged between the belt-like sections A and the belt-like sections B and extend parallel with the belt-like sections A and the belt-like sections B. Each of the belt-like sections C is formed in such a manner that cuts 31a and bending lines 31b are aligned in the direction in which the belt-like section C extends. Each of the cuts 31a and the associated one of the bending lines 31b form an isosceles trapezoid with the bending line 31b serving as the bottom side. Each of the isosceles trapezoids formed by the cuts 31a and the bending lines 31b is inclined at a predetermined angle with respect to the alignment direction, or the extending direction of the belt-like sections C.

To form the louvers 31 in the thin aluminum plate 90, which is configured as above-described, the sections defined by the cuts 31a are bent along the bending lines 31b from the side farther from the viewer of FIG. 3 to the side closer to the viewer of the drawing. Subsequently, the thin aluminum plate 90 is bent in such a manner that the belt-like sections A form the troughs 21c and the belt-like sections B form the crests 21b. In this manner, the corrugated fin body 1a is provided. In the thus obtained corrugated fin body 1a, the belt-like sections C form the side walls 21a and each of the fins 21 has a rectangular cross section, or an angulated cross section.

The two opposing sets of the louvers 31 in each of the fins 21, or the set of the louvers 31 formed in one of the two adjacent side walls 21a and the set of the louvers 31 formed in the other, are inclined in opposite directions with respect to the flow direction of the cooling medium. Thus, as indicated by the arrows in FIG. 2, the cooling medium at least rotates in the fins 21.

The heat sink 1 for power module according to the first embodiment forms a power module if an insulated circuit substrate 102 on which the power devices 101 such as semiconductor chips are mounted is arranged on the surface of the heat sink 1. The power module may be used in an inverter circuit of a movable body such as a hybrid vehicle, which uses an electric motor as one of its drive sources. The power module thus adjusts the power supplied to the electric motor or the like in correspondence with the operating state of the movable body. The power module transmits intense heat generated by the power devices 101 to the heat sink 1 for power module through the insulated circuit substrate 102. The heat is then dissipated by the cooling medium flowing in the refrigerant passage 1d.

The heat sink 1 for power module according to the first embodiment includes the corrugated fin body 1a in the refrigerant passage 1d. The corrugated fin body 1a has the crests 21b and the troughs 21c, which extend in the flow direction of the cooling medium, and the side walls 21a. Each of the side walls 21a connects the corresponding one of the crests 21b with the adjacent one of the troughs 21c. Each adjacent pair of the side walls 21a and the associated one of the crests 21b, which is located between the side walls 21a, form the corresponding one of the fins 21. Each of the side walls 21a has the louvers 31, which operate to, at least, rotate the cooling medium flowing in the associated fin 21. Thus, the heat sink 1 for power module facilitates flow of the cooling medium between an area thermally close to the power devices 101 and an area thermally far from the power devices 101. This suppresses nonuniform distribution of the temperature of the cooling medium in the refrigerant passage 1d, allowing the cooling medium to effectively perform cooling. The heat dissipating efficiency is thus improved. As a result, the heat sink 1 for power module effectively transmits heat from the inner surfaces of the refrigerant passage 1d and the surfaces of the fins 21 to the cooling medium.

Accordingly, the heat sink 1 for power module according to the first embodiment further improves the heat dissipating performance.

Further, since the louvers 31 operate to, at least, rotate the cooling medium, erosion is prevented and durability is improved in the heat sink 1 for power module.

Further, the two opposing sets of the louvers 31 in each of the fins 21 of the heat sink 1 for power module are inclined in opposite directions with respect to the flow direction of the cooling medium. The cooling medium is thus guided by the louvers 31 as indicated by the arrows in FIG. 2. Specifically, when the cooling medium flows along one of the side walls 21a of each fin 21, the cooling medium is guided by the louvers 31 of the side wall 21a. This sends the cooling medium to the other of the side walls 21a past the crest 21b or the trough 21c. The cooling medium is then further guided by the louvers 31 of the side wall 21a. In this manner, the cooling medium proceeds in the refrigerant passage 1d while rotating in each of the fins 21.

Each of the louvers 31 of the heat sink 1 for power module is formed through bending of the corresponding one of the portions of the side wall 21a defined by the cuts 31a. This facilitates the formation of the louvers 31 and lowers the manufacturing costs. In this case, when flowing in each fin 21, the cooling medium passes through the openings in the side walls 21a provided through formation of the louvers 31. The cooling medium thus moves to the exterior of the fin 21 through the side walls 21a. This further effectively suppresses the nonuniform distribution of the temperature of the cooling medium.

Also, each of the waves formed by the corrugated fin body 1a of the heat sink 1 for power module has a rectangular shape. That is, each crest 21b and each trough 21c have an angulated cross section. The distance between the side walls 21a of each fin 21 is substantially constant in the direction along the height (the up-and-down direction of FIG. 2). This makes it easy for the louvers 31, which are located in the fins 21, to guide the cooling medium. Accordingly, the nonuniform temperature distribution of the cooling medium is further effectively suppressed.

Second Embodiment

A second embodiment also corresponds to the first invention.

A heat sink 2 for power module corresponding to the second embodiment will hereafter be explained, mainly with regard to the differences between the heat sink 2 and the heat sink 1 for power module according to the first embodiment.

Figure 4:
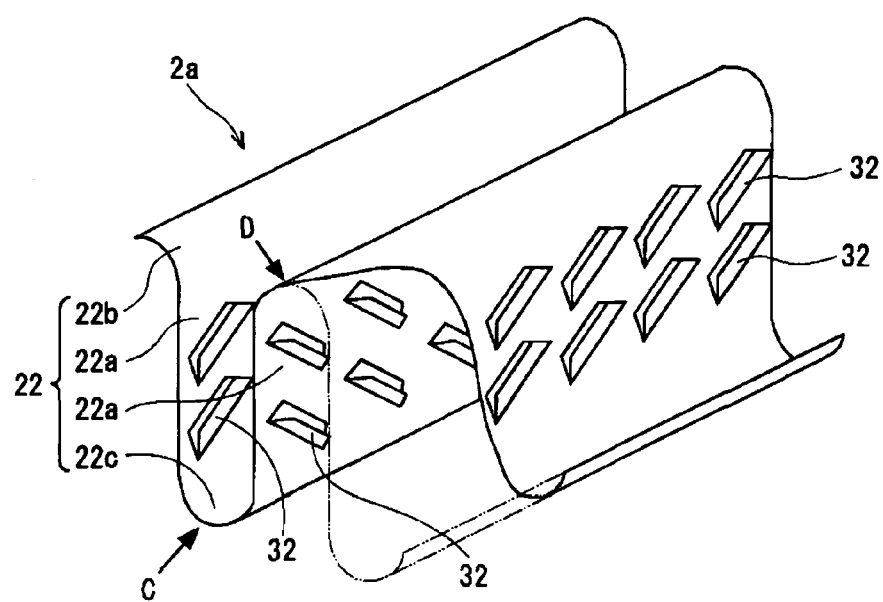
FIG. 4 is a perspective view schematically showing a corrugated fin body of a heat sink for power module according to a second embodiment.
Figure 5:
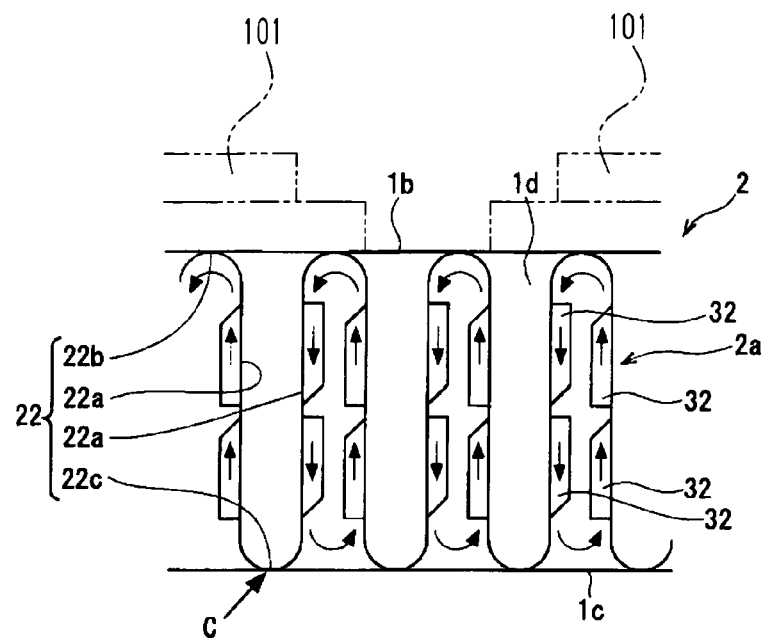
FIG. 5 is a cross-sectional view schematically showing the heat sink for power module according to the second embodiment.

As shown in FIG. 5, a corrugated fin body 2a is arranged in the refrigerant passage 1d of the heat sink 2 for power module. With reference to FIGS. 4 and 5, the corrugated fin body 2a has crests 22b and troughs 22c, which extend in the flow direction of the cooling medium, and side walls 22a. The crests 22b and the troughs 22c are alternately provided in a direction perpendicular to the flow direction of the cooling medium. Each of the side walls 22a connects the corresponding one of the crests 22b with the adjacent one of the troughs 22c. Each adjacent pair of the side walls 22a and the associated one of the crests 22b, which is located between the side walls 22a, form a fin 22. Each of the crests 22b and each of the troughs 22c of the corrugated fin body 2a have roundly curved shapes. Specifically, each crest 22b and each trough 22c of the corrugated fin body 2a have smoothly curved cross sections. This reduces the machining costs compared to the crests 21b and the troughs 21c according to the first embodiment, which have the angulated cross sections. Each of the side walls 22a has two sets of louvers 32 located at mutually different positions in the direction along the height of the side wall 22a (or the direction along the height of each of the waves formed by the corrugated fin body 2a). The angles of the louvers 32 with respect to the flow direction of the cooling medium or the sizes of the louvers 32 may be varied between the lower set and the upper set. In this manner, the rotating flow of the cooling medium is easily regulated.

The heat sink 2 for power module according to the second embodiment, which is configured as above-described, has the advantages equivalent to those of the heat sink 1 for power module according to the first embodiment.

Third Embodiment

A third embodiment also corresponds to the first invention.

A heat sink 3 for power module corresponding to the third embodiment will hereafter be explained, mainly with regard to the differences between the heat sink 3 and the heat sink 1 for power module according to the first embodiment.

Figure 6:
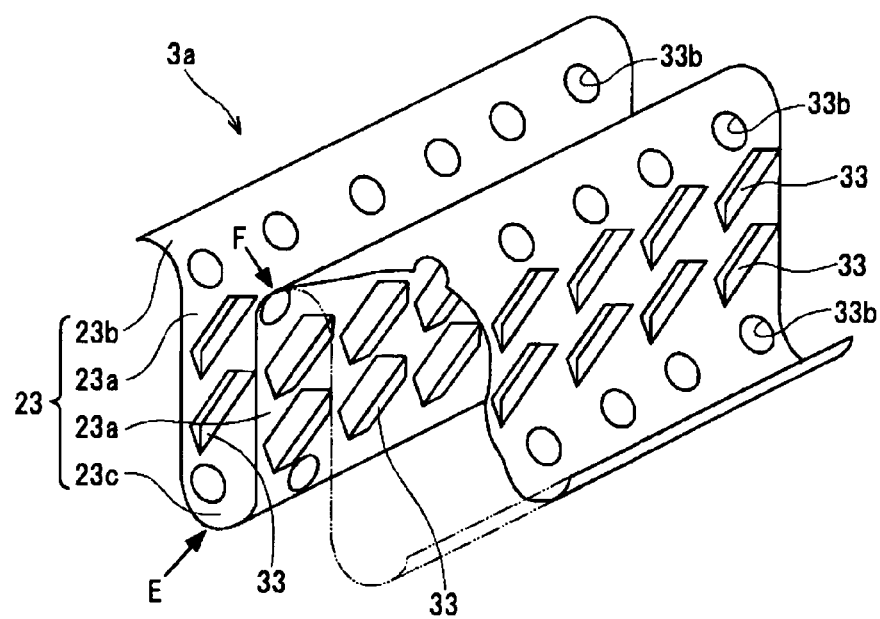
FIG. 6 is a perspective view schematically showing a corrugated fin body of a heat sink for power module according to a third embodiment.
Figure 7:
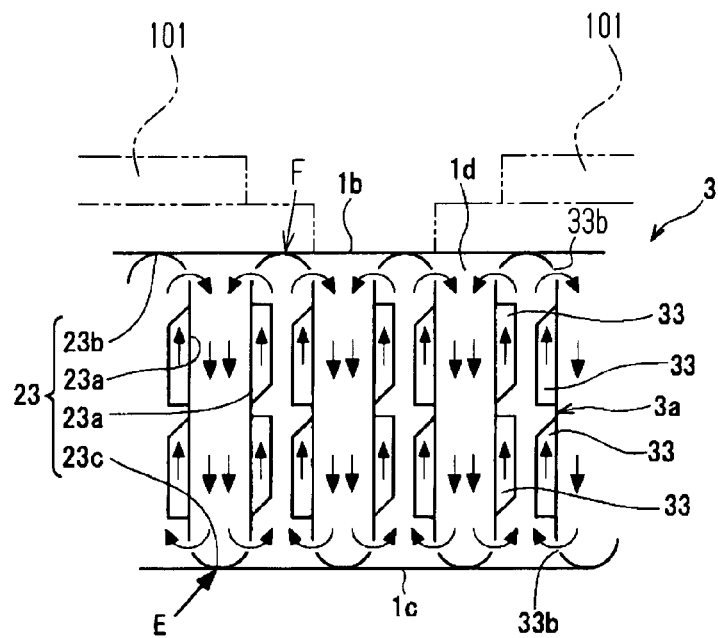
FIG. 7 is a cross-sectional view schematically showing the heat sink for power module according to the third embodiment.

As shown in FIG. 7, a corrugated fin body 3a is arranged in the refrigerant passage 1d of the heat sink 3 for power module. With reference to FIGS. 6 and 7, the corrugated fin body 3a has crests 23b and troughs 23c, which extend in the flow direction of the cooling medium, and side walls 23a. The crests 23b and the troughs 23c are alternately provided in a direction perpendicular to the flow direction of the cooling medium. Each of the side walls 23a connects the corresponding one of the crests 23b with the adjacent one of the troughs 23c. Each adjacent pair of the side walls 23a and the associated one of the crests 23b, which is located between the side walls 23a, form a fin 23. Each of the crests 23b and each of the troughs 23c of the corrugated fin body 3a have roundly curved shapes. In other words, each crest 23b and each trough 23c of the corrugated fin body 3a have smoothly curved cross sections. Each of the side walls 23a has two sets of louvers 33 located at mutually different positions in the direction along the height of the side wall 23a (or the direction along the height of each of the waves formed by the corrugated fin body 3a). The two opposing sets of the louvers 33 in each of the fins 23, or the set of the louvers 33 formed in one of the two adjacent side walls 23a and the set of the louvers 33 formed in the other, are inclined in the same direction with respect to the flow direction of the cooling medium. Further, a number of through holes 33b are provided in each of the side walls 23a at the two ends of the side wall 23a in the direction along the height of the side wall 23a (or the two ends of the side wall 23a in the direction along the height of each of the waves formed by the corrugated fin body 3a) and arranged in parallel with the louvers 33.

In the heat sink 3 for power module, which is configured as above-described, the cooling medium is guided by the louvers 33 as indicated by the arrows in FIG. 7. Specifically, the cooling medium flows through the through holes 33b and moves between the interior and the exterior of the fins 23. In this manner, the cooling medium proceeds in the refrigerant passage 1d while rotating. In other words, the cooling medium proceeds in the refrigerant passage 1d while rotating around the side walls 23a through the through holes 33b. Thus, the heat sink 3 for power module according to the third embodiment has the advantages equivalent to those of the heat sinks 1, 2 for power module according to the first and second embodiments.

Fourth Embodiment

A fourth embodiment also corresponds to the first invention.

A heat sink 4 for power module corresponding to the fourth embodiment will hereafter be explained, mainly with regard to the differences between the heat sink 4 and the heat sink 2 for power module according to the second embodiment.

Figure 8:
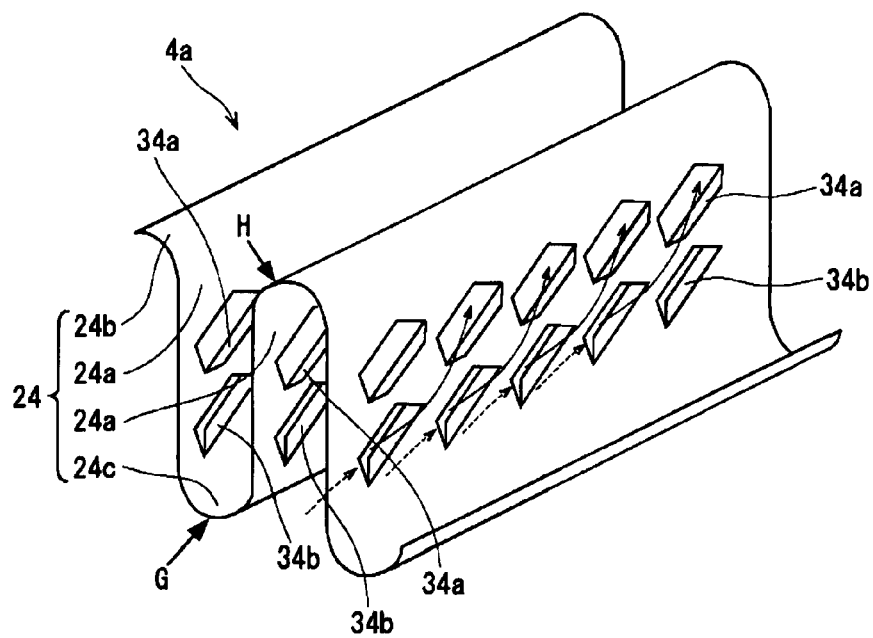
FIG. 8 is a perspective view schematically showing a corrugated fin body of a heat sink for power module according to a fourth embodiment.
Figure 9:
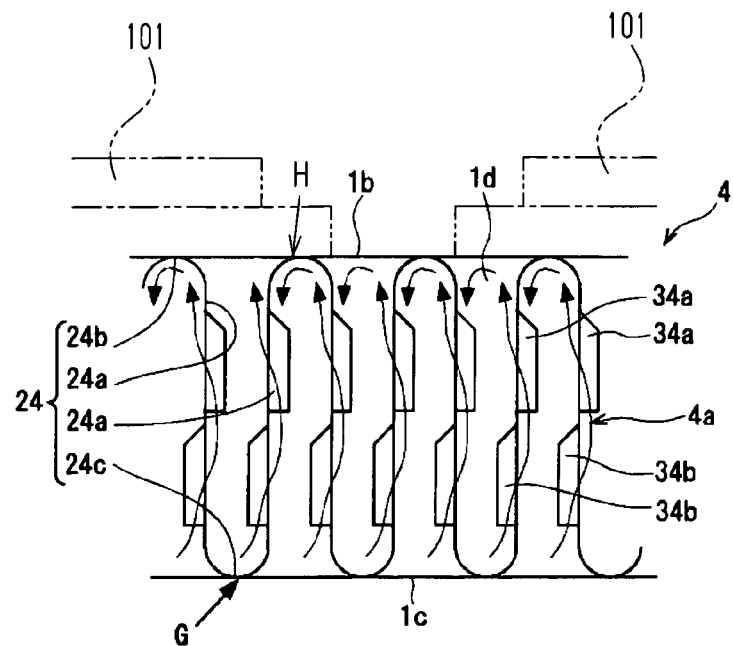
FIG. 9 is a cross-sectional view schematically showing the heat sink for power module according to the fourth embodiment.

As shown in FIG. 9, a corrugated fin body 4a is arranged in the refrigerant passage 1d of the heat sink 4 for power module. With reference to FIGS. 8 and 9, the corrugated fin body 4a has crests 24b and troughs 24c, which extend in the flow direction of the cooling medium, and side walls 24a. The crests 24b and the troughs 24c are alternately provided in a direction perpendicular to the flow direction of the cooling medium. Each of the side walls 24a connects the corresponding one of the crests 24b with the adjacent one of the troughs 24c. Each adjacent pair of the side walls 24a and the associated one of the crests 24b or the associated one of the troughs 24c, which is located between the side walls 24a, form a fin 24. Each of the crests 24b and each of the troughs 24c of the corrugated fin body 4a have roundly curved shapes. That is, each crest 24b and each trough 24c of the corrugated fin body 4a have smoothly curved cross sections. Each of the side walls 24a has upper louvers 34a and lower louvers 34b, which are located at mutually different positions in the direction along the height of the side wall 24a (or the direction along the height of each of the waves formed by the corrugated fin body 4a). The upper louvers 34a and the lower louvers 34b are inclined in the same direction with respect to the flow direction of the cooling medium. Further, each of the upper louvers 34a and each of the lower louvers 34b are formed from portions of the side walls 24a defined by cuts that are bent in opposite directions.

In the heat sink 4 for power module according to the fourth embodiment, which is configured as above-described, the cooling medium is guided by the louvers 34a, 34b, as indicated by the arrows in FIG. 9. Specifically, when flowing in each of the fins 24, the cooling medium is guided by the louvers 34a, 34b to rotate in the fin 24. Meanwhile, the cooling medium passes through the openings that are provided in the side walls 24a through formation of the louvers 34a, 34b. In this manner, the cooling medium moves to the exterior of the fin 21 through the side walls 24a. In other words, the cooling medium moves between the interior and the exterior of the fin 24 through the holes defined in the side walls 24a through the formation of the louvers 34a, 34b. In this manner, the cooling medium proceeds in the refrigerant passage 1d while rotating. Thus, the heat sink 4 for power module according to the fourth embodiment has the advantages equivalent to those of the heat sinks 1 to 3 for power module according to the first to third embodiments.

Fifth Embodiment

A fifth embodiment corresponds to the second invention.

Figure 11:
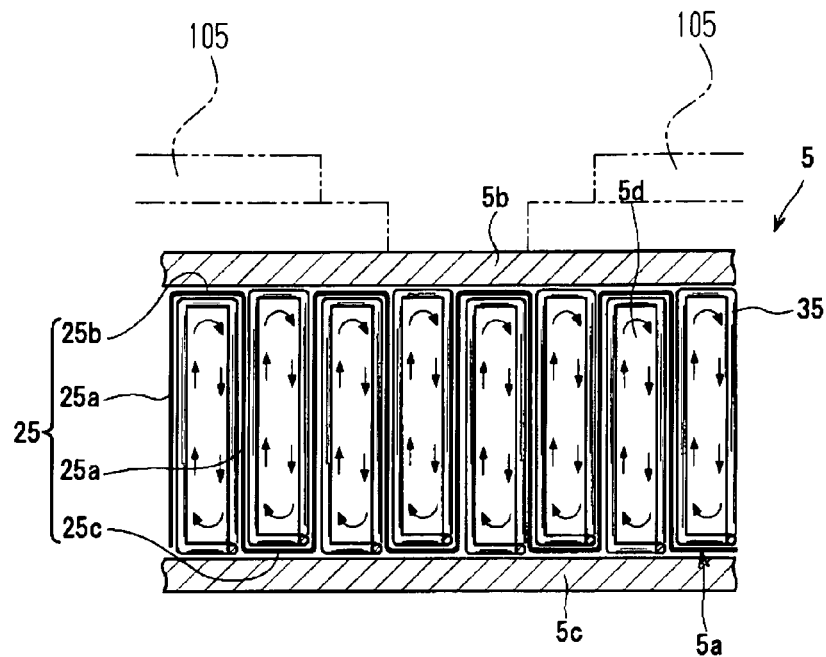
FIG. 11 is a cross-sectional view schematically showing the heat sink for power module according to the fifth embodiment.

Power devices 105 may be mounted on a surface of a heat sink 5 for power module according to the fifth embodiment, which is shown in FIG. 11. The heat sink 5 has a refrigerant passage 5d in which cooling medium for dissipating heat generated by the power devices 105 flows.

The refrigerant passage 5d of the heat sink 5 for power module is a space with a rectangular cross section surrounded by a surface 5b, a backside 5c, and side surfaces (not shown), which are provided at opposing sides. The cooling medium flows from the side closer to the viewer of FIG. 11 toward the side farther from the viewer of the drawing.

A corrugated fin body 5a is arranged in the refrigerant passage 5d. The corrugated fin body 5a has crests 25b and troughs 25c, which extend in the flow direction of the cooling medium, and side walls 25a. The crests 25b and the troughs 25c are alternately provided in a direction perpendicular to the flow direction of the cooling medium. Each of the side walls 25a connects the corresponding one of the crests 25b with the adjacent one of the troughs 25c. Each adjacent pair of the side walls 25a and the associated one of the crests 25b or the associated one of the troughs 25c, which is located between the side walls 25a, form a fin 25. The outline of each crest 25b and the outline of each trough 25c have a small bending radius but substantially define right angles. In other words, each of the waves formed by the corrugated fin body 5a has a rectangular shape. That is, each of the crests 25b and each of the troughs 25c have angulated cross sections.

Figure 10:
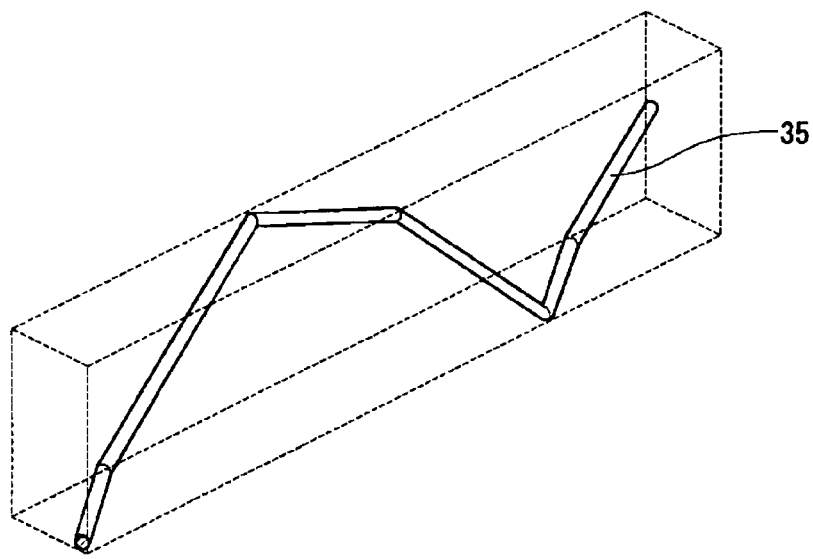
FIG. 10 is a perspective view schematically showing a guide of a heat sink for power module according to a fifth embodiment.

Referring to FIGS. 10 and 11, a guide 35 formed by an aluminum wire is provided in each of the fins 25. Each of the guides 35 extends in the flow direction of the cooling medium while rotating along the inner side of the fin 25. Thus, as indicated by the arrows in FIG. 11, the cooling medium proceeds in the refrigerant passage 5d while being rotated and stirred in the fin 25.

In the heat sink 5 for power module according to the fifth embodiment, which has the above-described structure, the cooling medium flowing in each fin 25 is at least rotated and stirred by the associated guide 35. Thus, the cooling medium easily flows between an area thermally close to the power devices 105 and an area thermally far from the power devices 105. This suppresses nonuniform distribution of the temperature of the cooling medium in the refrigerant passage 5d, allowing the cooling medium to effectively perform cooling. The heat dissipating efficiency is thus improved. As a result, the heat sink 5 for power module also effectively transmits heat from the inner surfaces of the refrigerant passage 5d and the surfaces of the fins 25 to the cooling medium.

Accordingly, the heat sink 5 for power module according to the fifth embodiment further improves the heat dissipating performance.

Also, each of the waves formed by the corrugated fin body 5a of the heat sink 5 for power module has a rectangular shape. The distance between the side walls 25a of each fin 25 is substantially constant in the direction along the height (the up-and-down direction of FIG. 11). This makes it easy for the guides 35, which are located in the fins 25, to guide the cooling medium.

Sixth Embodiment

A sixth embodiment also corresponds to the second invention.

Figure 12:
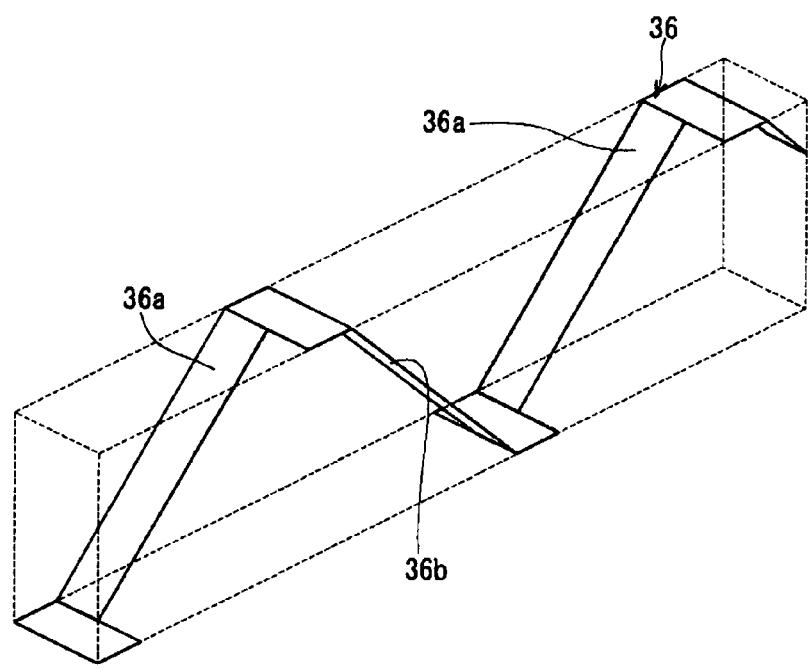
FIG. 12 is a perspective view schematically showing a guide of a heat sink for power module according to a sixth embodiment.
Figure 13:
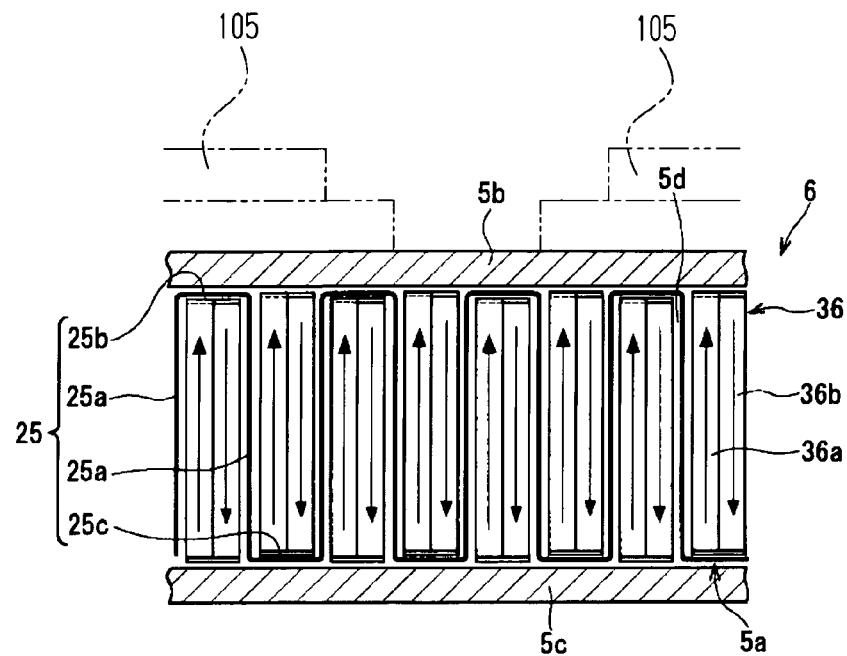
FIG. 13 is a cross-sectional view schematically showing the heat sink for power module according to the sixth embodiment.

As shown in FIGS. 12 and 13, in a heat sink 6 for power module according to the sixth embodiment, instead of the guide 35 of the heat sink 5 for power module according to the fifth embodiment, a guide 36 having a different shape is provided in each of the fins 25. The other portions of the sixth embodiment are configured identically to the corresponding portions of the heat sink 5 for power module according to the fifth embodiment. Description of these portions will thus be omitted.

Referring to FIG. 12, each of the guides 36 is formed through cutting and bending of a thin metal plate. Each guide 36 has first slanted surfaces 36a that contact only one of the two associated side walls 25a and second slanted surface 36b that contact only the other of the side walls 25a. The first slanted surfaces 36a and the second slanted surfaces 36b are alternately arranged in a repeated manner. Each of the first slanted surfaces 36a and each of the second slanted surfaces 36b are inclined in opposite directions with respect to the flow direction of the cooling medium. Thus, as indicated by the arrows in FIG. 13, the cooling medium proceeds in the refrigerant passage 5d while being stirred in each of the fins 25.

In the heat sink 6 for power module according to the sixth embodiment, which is configured as above described, the cooling medium flowing in each fin 25 is stirred by the associated guide 36. Thus, the cooling medium easily flows between an area thermally close to the power devices 105 and an area thermally far from the power devices 105. This suppresses nonuniform distribution of the temperature of the cooling medium in the refrigerant passage 5d, allowing the cooling medium to effectively perform cooling. The heat dissipating efficiency is thus improved. As a result, the heat sink 6 for power module also effectively transmits heat from the inner surfaces of the refrigerant passage 5d and the surfaces of the fins 25 to the cooling medium. Accordingly, the heat sink 6 for power module according to the sixth embodiment has the advantages equivalent to those of the heat sink 5 for power module according to the fifth embodiment.

Seventh Embodiment

A seventh embodiment also corresponds to the second invention.

Figure 14:
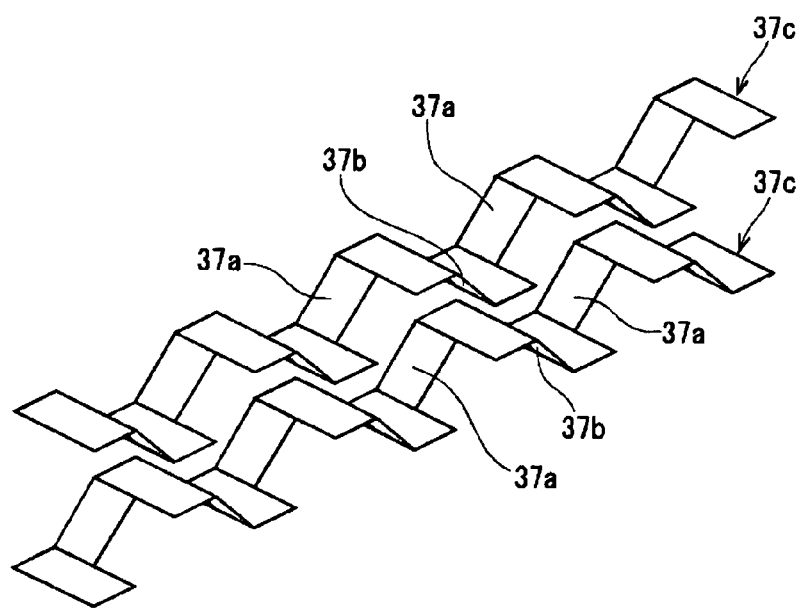
FIG. 14 is a perspective view schematically showing a guide forming member of a heat sink for power module according to a seventh embodiment.
Figure 15:
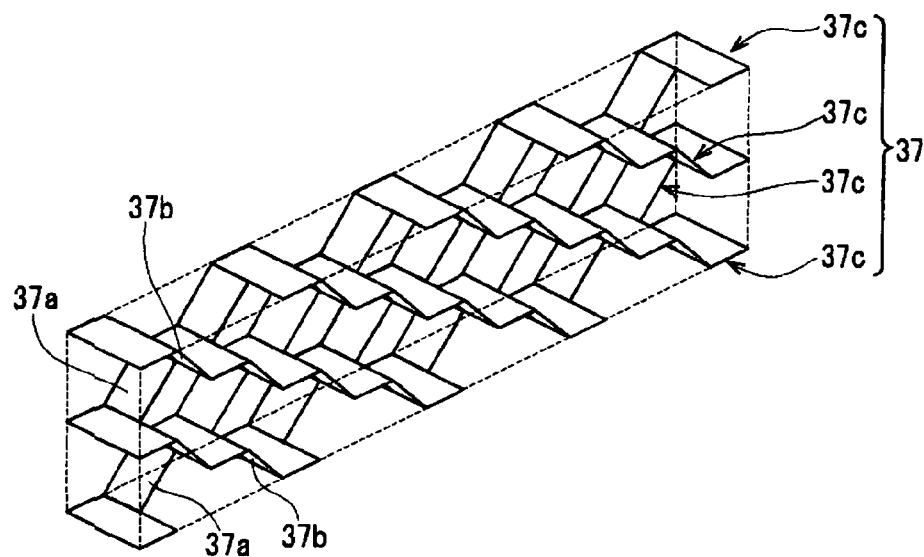
FIG. 15 is a perspective view schematically showing a guide of the heat sink for power module according to the seventh embodiment.
Figure 16:
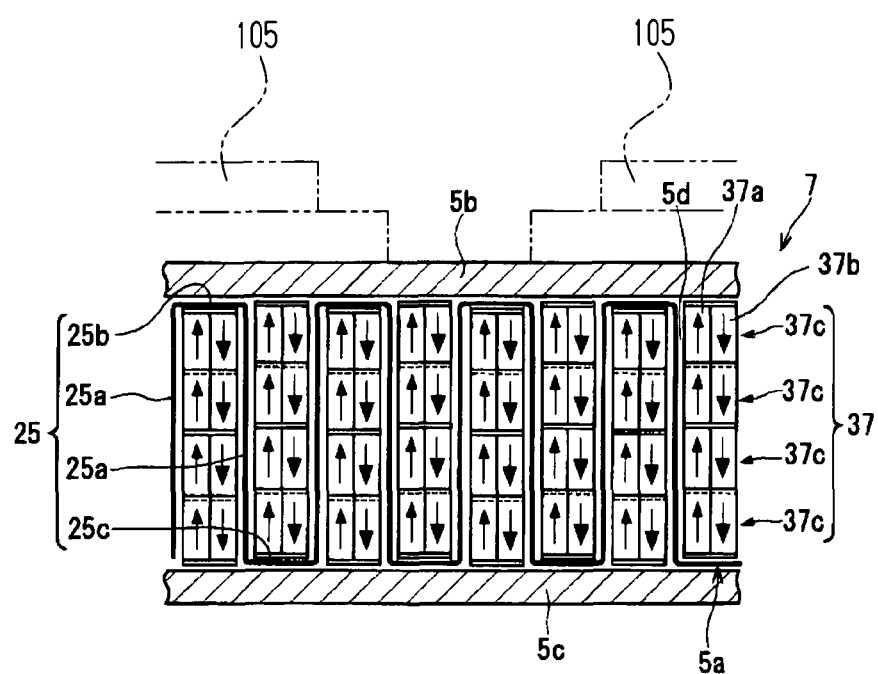
FIG. 16 is a cross-sectional view schematically showing the heat sink for power module according to the seventh embodiment.

As shown in FIGS. 14, 15, and 16, in a heat sink 7 for power module according to the seventh embodiment, instead of the guide 36 of the heat sink 6 for power module according to the sixth embodiment, a guide 37 having a different shape is provided in each of the fins 25. The other portions of the seventh embodiment are configured identically to the corresponding portions of the heat sink 6 for power module according to the sixth embodiment. Description of these portions will thus be omitted.

Referring to FIGS. 14 and 15, each of the guides 37 is formed by guide forming members 37c that are stacked. Each of the guide forming members 37c is formed through cutting and bending of a thin metal plate.

The height of each guide forming member 37c is smaller than the height of the guide 36 according to the sixth embodiment (FIG. 12). Each guide forming member 37c has first slanted surfaces 37a that contact only one of the two associated side walls 25b and second slanted surface 37b that contact only the other of the side walls 25a. The first slanted surfaces 37a and the second slanted surfaces 37b are alternately arranged in a repeated manner. Each of the first slanted surfaces 37a and each of the second slanted surfaces 37b are inclined in opposite directions with respect to the flow direction of the cooling medium. Thus, as indicated by the arrows in FIG. 16, the cooling medium proceeds in the refrigerant passage 5d while being intensely stirred in each of the fins 25.

In the heat sink 7 for power module according to the seventh embodiment, which is configured as above described, the cooling medium flowing in each fin 25 is stirred by the associated guide 37. Thus, the cooling medium easily flows between an area thermally close to the power devices 105 and an area thermally far from the power devices 105. This suppresses nonuniform distribution of the temperature of the cooling medium in the refrigerant passage 5d, allowing the cooling medium to effectively perform cooling. The heat dissipating efficiency is thus improved. As a result, the heat sink 7 for power module also effectively transmits heat from the inner surfaces of the refrigerant passage 5d and the surfaces of the fins 25 to the cooling medium. Accordingly, the heat sink 7 for power module according to the seventh embodiment has the advantages equivalent to those of the heat sinks 5, 6 for power module according to the fifth and sixth embodiments.

Eighth Embodiment

An eighth embodiment corresponds to the third invention.

Figure 18:
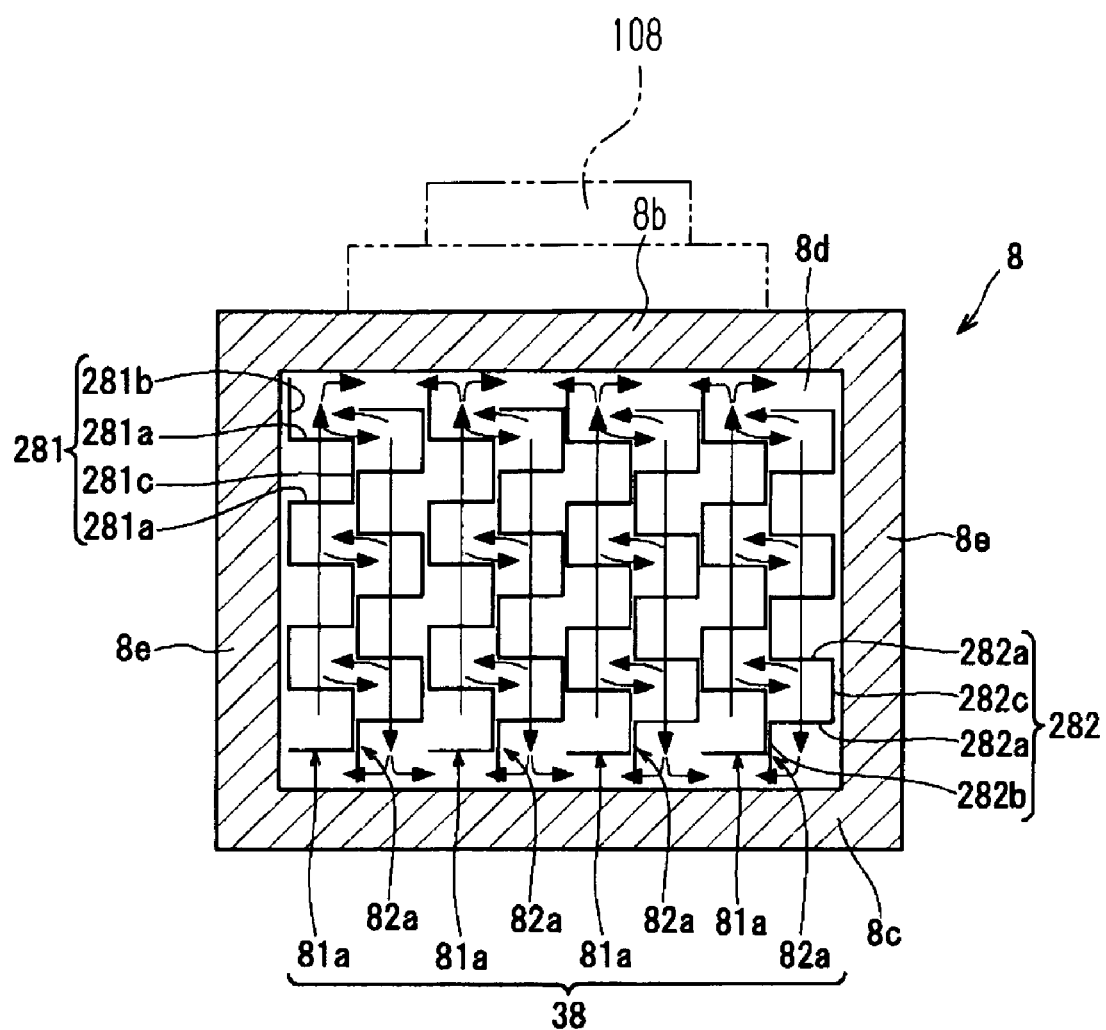
FIG. 18 is a cross-sectional view schematically showing the heat sink for power module according to the eighth embodiment.

A power device 108 may be mounted on a surface of a heat sink 8 for power module according to the eighth embodiment, which is shown in FIG. 18. The heat sink 8 has a refrigerant passage 8d in which cooling medium for dissipating heat generated by the power device 108 flows.

The refrigerant passage 8d of the heat sink 8 for power module is a space with a rectangular cross section surrounded by a surface 8b, a backside 8c, and side surfaces 8e, which are provided at opposing sides. The cooling medium flows from the side closer to the viewer of FIG. 18 toward the side farther from the viewer of the drawing.

A guide member 38 having first guide plates 81a and second guide plates 82a is provided in the refrigerant passage 8d.

Figure 17:
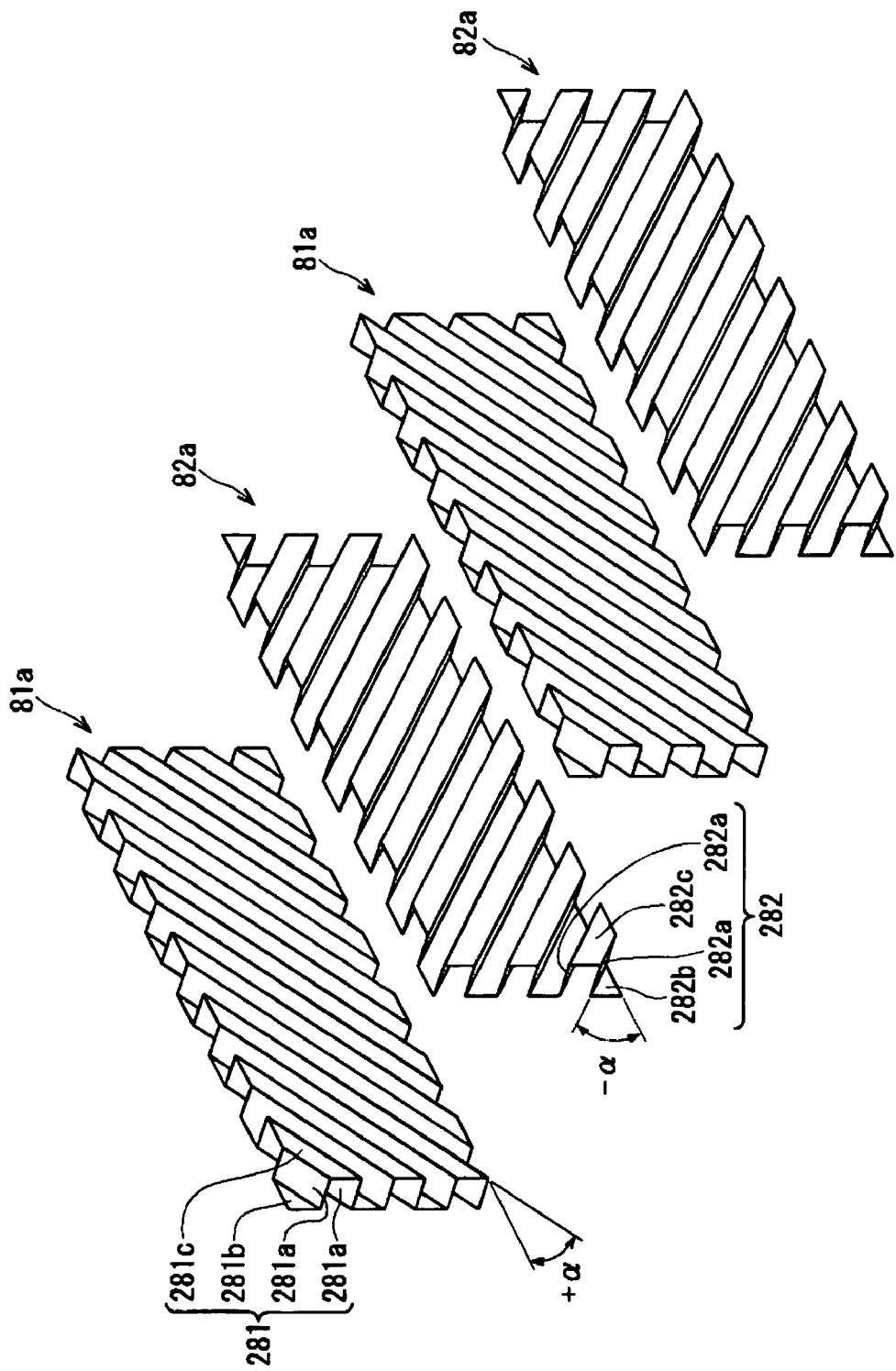
FIG. 17 is a perspective view schematically showing a first guide plate and a second guide plate of a heat sink for power module according to an eighth embodiment.

With reference to FIG. 17, each of the first guide plates 81a is formed by a corrugated fin body formed of aluminum, which includes crests 281b and troughs 281c that are arranged alternately and side walls 281a each of which connects the corresponding one of the crests 281b with the adjacent one of the troughs 281c. Each adjacent pair of the side walls 281a and the associated one of the crests 281b or the associated one of the troughs 281c, which is arranged between the side walls 281a, form a first fin 281. The first fin 281 guides the cooling medium in a direction inclined at a first angle (+α) with respect to the flow direction of the cooling medium.

Like the first guide plates 81a, each of the second guide plates 82a is formed by a corrugated fin body formed of aluminum, which includes crests 282b and troughs 282c that are arranged alternately and side walls 282a each of which connects the corresponding one of the crests 282b with the adjacent one of the troughs 282c. Each adjacent pair of the side walls 282a and the associated one of the crests 282b or the associated one of the troughs 282c, which is arranged between the side walls 282a, form a second fin 282. The second fin 282 guides the cooling medium in a direction inclined at a second angle (−α), which is different from the first angle (+α), with respect to the flow direction of the cooling medium.

The guide member 38 is formed by the first guide plates 81a and the second guide plates 82a that are alternately stacked. In the guide member 38, the first fins 281 and the second fins 282 are inclined with respect to the flow direction of the cooling medium in such a manner that the first fins 281 cross the second fins 282.

In the heat sink 8 for power module according to the eighth embodiment, which has the above-described configuration, the cooling medium moves from the inner side of each first fin 281 of the first guide plate 81a to the inner side of the corresponding second fin 282 of the second guide plate 82a at the side corresponding to the surface 8b of the refrigerant passage 8d, as indicated by the corresponding arrows in FIG. 18. The cooling medium then proceeds in the inner side of the second fin 282 in a direction inclined at the second angle (−α) with respect to the flow direction of the cooling medium. Afterward, the cooling medium reaches the inner side of the corresponding first fin 281 of the first guide plate 81a at the side corresponding to the backside 8c of the refrigerant passage 8d. The cooling medium then proceeds in the inner side of the first fin 281 in a direction inclined at the first angle (+α) with respect to the flow direction of the cooling medium. Further, the cooling medium flows from the inner side of each first fin 281 of the first guide plate 81a to the inner side of the corresponding second fin 282 of the second guide plate 82a at a position in the first fin 281. Likewise, the cooling medium flows from the inner side of each second fin 282 of the second guide plate 82a to the inner side of the corresponding first fin 281 of the first guide plate 81a at a position in the second fin 282. Thus, the cooling medium easily flows between an area thermally close to the power device 108 and an area thermally far from the power device 108. This suppresses nonuniform distribution of the temperature of the cooling medium in the refrigerant passage 8d, allowing the cooling medium to effectively perform cooling. The heat dissipating efficiency is thus improved. As a result, the heat sink 8 for power module effectively transmits heat from the inner surfaces of the refrigerant passage 8d and the surfaces of the fins 281, 282 to the cooling medium.

Accordingly, the heat sink 8 for power module according to the eighth embodiment further improves the heat dissipating performance.

Ninth Embodiment

A ninth embodiment also corresponds to the third invention.

Figure 19:
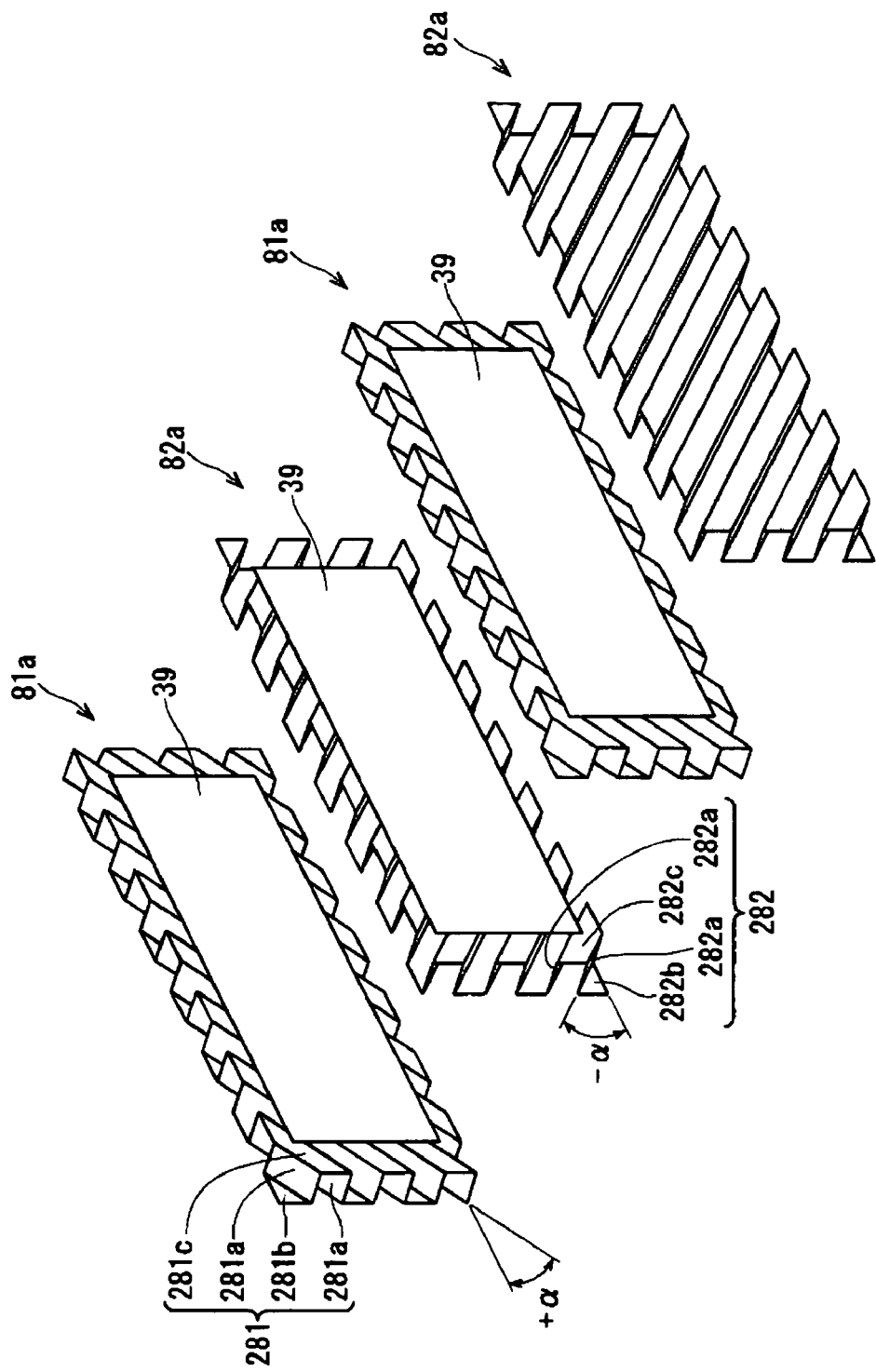
FIG. 19 is a perspective view schematically showing a first guide plate, a second guide plate, and a partition wall of a heat sink for power module according to a ninth embodiment.
Figure 20:
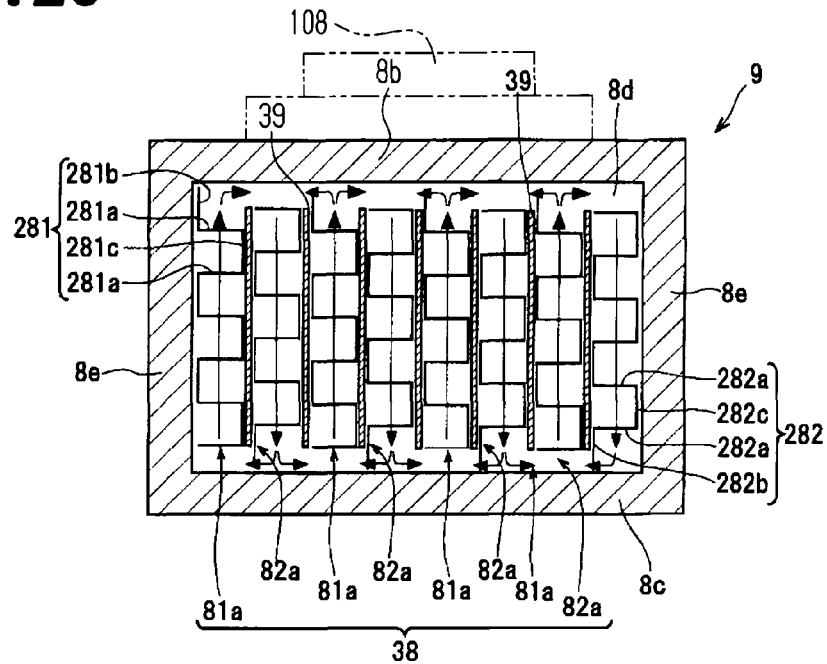
FIG. 20 is a cross-sectional view schematically showing the heat sink for power module according to the ninth embodiment.

In a heat sink 9 for power module according to the ninth embodiment, a partition wall 39 is arranged between each first guide plate 81a and the adjacent second guide plate 82a of the heat sink 8 for power module according to the eighth embodiment, as shown in FIGS. 19 and 20. The other portions of the ninth embodiment are configured identically to the corresponding portions of the heat sink 8 for power module. Thus, description of these portions will be omitted herein.

Each of the partition walls 39 is formed by a thin aluminum plate. Each partition wall 39 allows connection between the inner sides of the portions of the first fins 281 located at both ends of the partition wall 39 in the direction perpendicular to the flow direction of the cooling medium and the inner sides of the portions of the second fins 282 located at the same ends. Contrastingly, the partition wall 39 prevents connection between the inner sides of the portions of the first fins 281 located at the portions other than these ends and the inner sides of the portions of the second fins 282 located at the same portions.

In the heat sink 9 for power module according to the ninth embodiment, which has the above-described configuration, the cooling medium moves from the inner side of each first fin 281 of the first guide plate 81a to the inner side of the corresponding second fin 282 of the second guide plate 82a at the side corresponding to the surface 8b of the refrigerant passage 8d, as indicated by the corresponding arrows in FIG. 20. The cooling medium then proceeds in the inner side of the second fin 282 in a direction inclined at the second angle (−α) with respect to the flow direction of the cooling medium. Afterward, the cooling medium reaches the inner side of the corresponding first fin 281 of the first guide plate 81a at the side corresponding to the backside 8c of the refrigerant passage 8d. The cooling medium then proceeds in the inner side of the first fin 281 in a direction inclined at the first angle (+α) with respect to the flow direction of the cooling medium. On the other hand, the partition walls 39 prevent the cooling medium from flowing from the inner side of each first fin 281 of the first guide plate 81a to the inner side of the corresponding second fin 282 of the second guide plate 82a at a position in the first fin 281. Likewise, the partition walls 39 prevent the cooling medium from flowing from the inner side of each second fin 282 of the second guide plate 82a to the inner side of the corresponding first fin 281 of the first guide plate 81a at a position in the second fin 282. The cooling medium is thus effectively rotated and stirred in the heat sink 9 for power module. This makes it easy for the cooling medium to flow between an area thermally close to the power device 108 and an area thermally far from the power device 108. Nonuniform distribution of the temperature of the cooling medium in the refrigerant passage 8d is thus suppressed. Accordingly, the cooling medium effectively performs cooling, thus improving the heat dissipating efficiency. As a result, the heat sink 9 for power module effectively transmits heat from the inner surfaces of the refrigerant passage 8d and the surfaces of the fins 281, 282 to the cooling medium. Accordingly, the heat sink 9 for power module according to the ninth embodiment has the advantages equivalent to those of the heat sink 8 for power module according to the eighth embodiment.

Tenth Embodiment

A tenth embodiment corresponds to the fourth invention.

Figure 21:
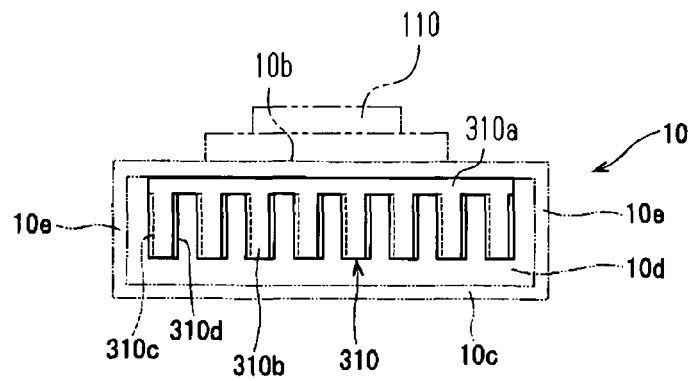
FIG. 21 is a front view schematically showing a heat sink for power module according to a tenth embodiment.
Figure 22:
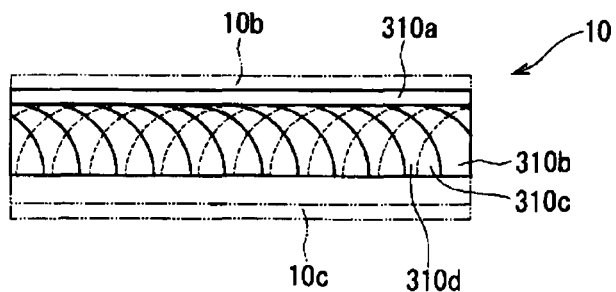
FIG. 22 is a side view schematically showing the heat sink for power module according to the tenth embodiment.
Figure 23:
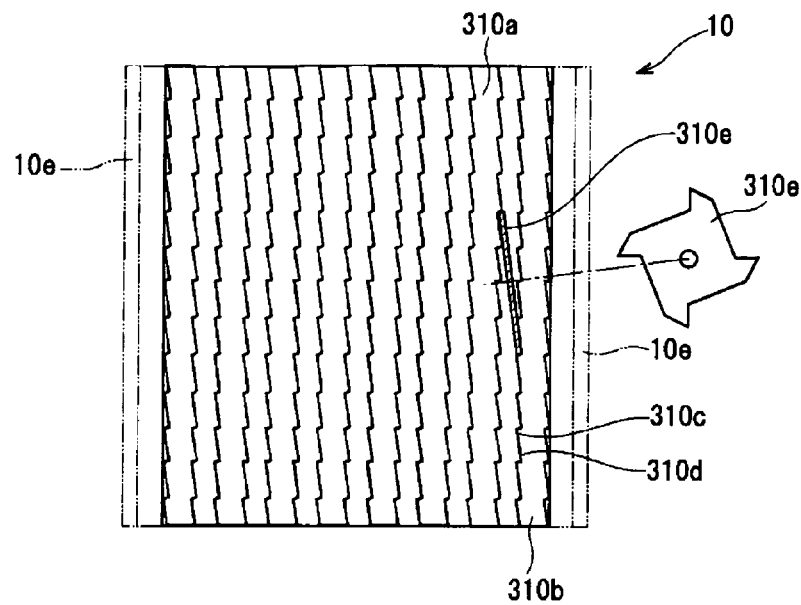
FIG. 23 is a bottom view schematically showing the heat sink for power module according to the tenth embodiment.

With reference to FIGS. 21, 22, and 23, a power device 110 may be mounted on a surface of a heat sink 10 for power module according to the tenth embodiment. The heat sink 10 has a refrigerant passage 10d in which cooling medium for dissipating heat generated by the power device 110 flows.

The refrigerant passage 10d of the heat sink 10 for power module is a space with a rectangular cross section surrounded by a surface 10b, a backside 10c, and side surfaces 10e, which are provided at opposing sides. The cooling medium flows from the side closer to the viewer of FIG. 21 toward the side farther from the viewer of the drawing.

A comb tooth member 310 formed of an aluminum extrusion is arranged in the refrigerant passage 10d. The comb tooth member 310 has a substrate 310a extending parallel with the surface on which the power device 110 is arranged and upright walls 310b projecting from the substrate 310a in a direction crossing the surface on which the power device 110 is provided. Each of the upright walls 310b extends in the flow direction of the cooling medium in the refrigerant passage 10d.

As shown in FIGS. 22 and 23, projections 310d and recesses 310c, which serve as guide portions, are provided on the side surfaces of each of the upright walls 310b and spaced at a predetermined interval. The projections 310d and the recesses 310c are provided through cutting of the side surfaces of each upright wall 310b using a rotary blade 310e. The projections 310d and the recesses 310c of each upright wall 310b operate to stir the cooling medium flowing between the upright wall 310b and the adjacent one of the upright walls 310b. To provide the projections 310d and the recesses 310c in the upright wall 310b, as illustrated in FIG. 23, the rotary blade 310e is applied to each adjacent pair of the upright walls 310b diagonally with respect to the extending direction of each upright wall 310b, in such a manner that the rotary blade 310e forms the projections 310d and the recesses 310c by simultaneously cutting the two opposing side surfaces of the upright walls 310b. Thus, the projections 310d and the recesses 310c, which are arranged on the two opposing side surfaces of the adjacent upright walls 310b, are inclined in opposite directions with respect to the flow direction of the cooling medium.

In the heat sink 10 for power module according to the tenth embodiment, the cooling medium is stirred by the guide portions formed by the projections 310d and the recesses 310c when flowing between the upright walls 310b of the comb tooth member 310. This makes it easy for the cooling medium to flow between an area thermally close to the power device 110 and an area thermally far from the power device 110. Nonuniform distribution of the temperature of the cooling medium in the refrigerant passage 10d is thus suppressed and the cooling medium effectively performs cooling. This improves the heat dissipating efficiency. As a result, the heat sink 10 for power module effectively transmits heat from the inner surfaces of the refrigerant passage 10d and the surfaces of the upright walls 310b to the cooling medium.

Accordingly, the heat sink 10 for power module according to the tenth embodiment further improves the heat dissipating performance.

Further, in the heat sink 10 for power module, the projections 310d and the recesses 310c, which are arranged at the two opposing side surfaces of each adjacent pair of the upright walls 310, are inclined in the opposite directions with respect to the flow direction of the cooling medium. Thus, the cooling medium easily moves between the opposing two side surfaces of the adjacent upright walls 310 while being guided by the projections 310d and the recesses 310c.

Although the surface 10b and the comb tooth member 310 are provided as separate bodies in the heat sink 10 for power module according to the tenth embodiment, the surface 10b and the comb tooth member 310 may be formed integrally with each other.

Eleventh Embodiment

An eleventh embodiment also corresponds to the fourth invention.

Figure 24:
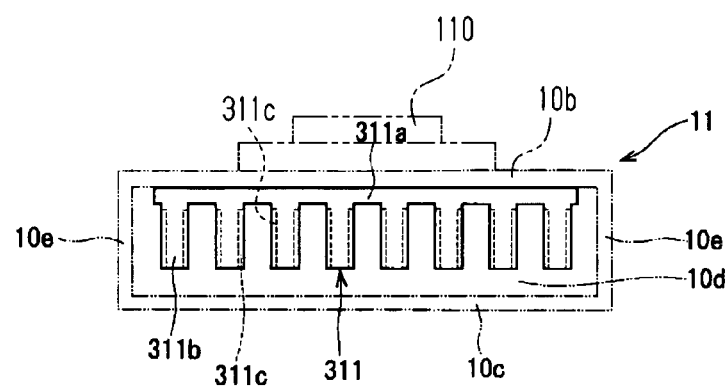
FIG. 24 is a front view schematically showing a heat sink for power module according to an eleventh embodiment.
Figure 25:
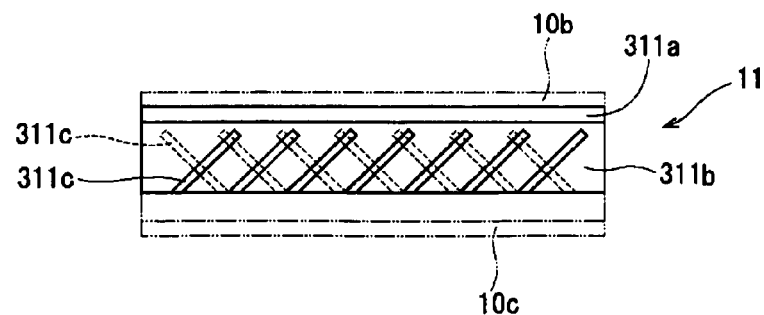
FIG. 25 is a side view schematically showing the heat sink for power module according to the eleventh embodiment.

In a heat sink 11 for power module according to the eleventh embodiment, a comb tooth member 311 shown in FIGS. 24 and 25 is provided in the refrigerant passage 10d, instead of the comb tooth member 310 of the heat sink 10 for power module according to the tenth embodiment. The other portions of the eleventh embodiment are configured identically to the corresponding portions of the heat sink 10 for power module according to the tenth embodiment. Description of these portions will thus be omitted herein.

The comb tooth member 311 is formed of an aluminum extrusion and has a substrate 311a extending parallel with the surface on which the power device 110 is arranged and upright walls 311b projecting from the substrate 311a in a direction crossing the surface on which the power device 110 is provided. Each of the upright walls 311b extends in the flow direction of the cooling medium in the refrigerant passage 10d.

Figure 26:
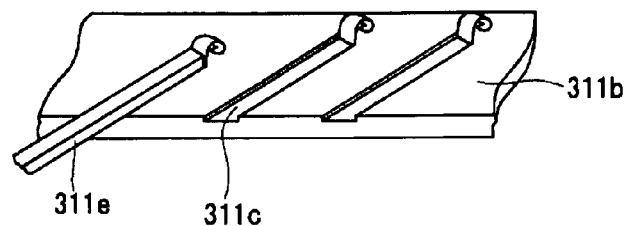
FIG. 26 is a perspective view schematically showing an upright wall and a recess of a comb tooth member of the heat sink for power module according to the eleventh embodiment.

As shown in FIG. 26, groove-like recesses 311c, each of which has a rectangular cross section and serves as a guide portion, are provided on the side surfaces of each of the upright walls 311b and spaced at a predetermined interval. The recesses 311c are provided through broaching of the side surfaces of each upright wall 311b using a broaching tool 311e. The recesses 311c of each upright wall 311b operate to stir the cooling medium flowing between the upright wall 311b and the adjacent one of the upright walls 311b. Referring to FIG. 25, the recesses 311c arranged on the two opposing side surfaces of each adjacent pair of the upright walls 311b are inclined in opposite directions with respect to the flow direction of the cooling medium.

Like the heat sink 10 for power module according to the tenth embodiment, in the heat sink 11 for power module according to the eleventh embodiment, which is configured as above-described, the cooling medium is stirred by the guide portions defined by the recesses 311c when flowing between the upright walls 311b of the comb tooth member 311. This makes it easy for the cooling medium to flow between an area thermally close to the power device 110 and an area thermally far from the power device 110. Nonuniform distribution of the temperature of the cooling medium in the refrigerant passage 10d is thus suppressed and the cooling medium effectively performs cooling. This improves the heat dissipating efficiency. As a result, the heat sink 11 for power module effectively transmits heat from the inner surfaces of the refrigerant passage 10d and the surfaces of the upright walls 311b to the cooling medium. Accordingly, the heat sink 11 for power module according to the eleventh embodiment has the advantages equivalent to those of the heat sink 10 for power module according to the tenth embodiment.

Twelfth Embodiment

A twelfth embodiment also corresponds to the fourth invention.

Figure 27:
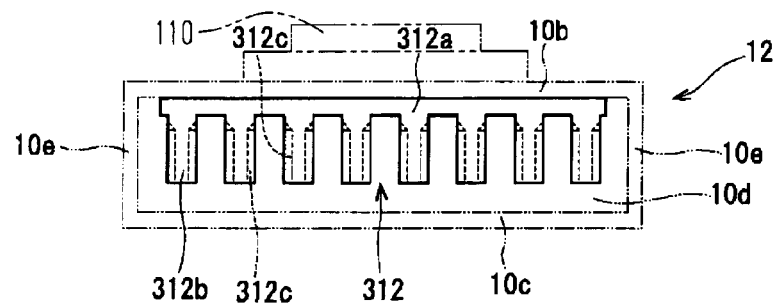
FIG. 27 is a front view schematically showing a heat sink for power module according to a twelfth embodiment.
Figure 28:
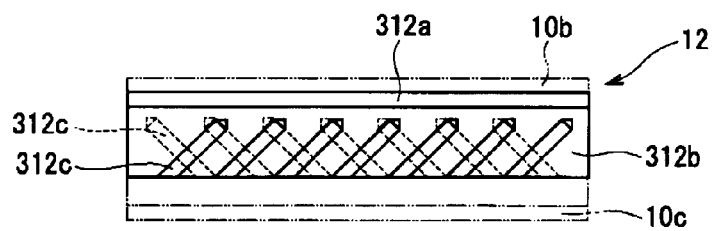
FIG. 28 is a side view schematically showing the heat sink for power module according to the twelfth embodiment.

In a heat sink 12 for power module according to the twelfth embodiment, a comb tooth member 312 shown in FIGS. 27 and 28 is provided in the refrigerant passage 10d, instead of the comb tooth member 310 of the heat sink 10 for power module according to the tenth embodiment. The other portions of the twelfth embodiment are configured identically to the corresponding portions of the heat sink 10 for power module according to the tenth embodiment. Description of these portions will thus be omitted herein.

The comb tooth member 312 is formed of an aluminum extrusion and has a substrate 312a extending parallel with the surface on which the power device 110 is arranged and upright walls 312b projecting from the substrate 312a in a direction crossing the surface on which the power device 110 is provided. Each of the upright walls 312b extends in the flow direction of the cooling medium in the refrigerant passage 10d.

Figure 29:
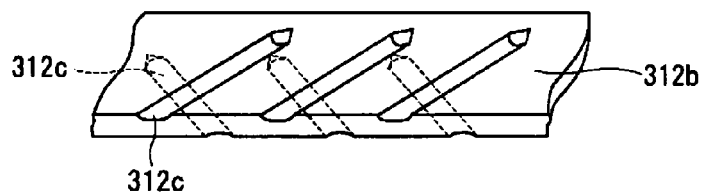
FIG. 29 is a perspective view schematically showing an upright wall and a recess of a comb tooth member of the heat sink for power module according to the twelfth embodiment.

As shown in FIG. 29, groove-like recesses 312c, each of which has a semi-circular cross section and serves as a guide portion, are provided on the side surfaces of each of the upright walls 312b and spaced at a predetermined interval. The recesses 312c are provided through cutting of the side surfaces of each upright wall 312b using a drill blade (not shown). The recesses 312c of each upright wall 312b operate to stir the cooling medium flowing between the upright wall 312b and the adjacent one of the upright walls 312b. Referring to FIG. 28, the recesses 312c arranged on the two opposing side surfaces of each adjacent pair of the upright walls 312b are inclined in opposite directions with respect to the flow direction of the cooling medium.

In the heat sink 12 for power module according to the twelfth embodiment, the cooling medium is stirred by the guide portions defined by the recesses 312c when flowing between the upright walls 312b of the comb tooth member 312. This makes it easy for the cooling medium to flow between an area thermally close to the power device 110 and an area thermally far from the power device 110. Nonuniform distribution of the temperature of the cooling medium in the refrigerant passage 10d is thus suppressed. Accordingly, the cooling medium effectively performs cooling and improves the heat dissipating efficiency. As a result, the heat sink 12 for power module has the advantages equivalent to those of the heat sinks 10, 11 for power module according to the tenth and eleventh embodiments.

Thirteenth Embodiment

A thirteenth embodiment also corresponds to the fourth invention.

Figure 30:
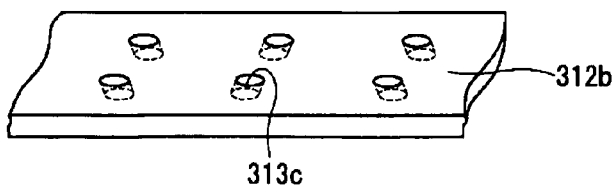
FIG. 30 is a perspective view schematically showing an upright wall and a through hole of a comb tooth member of a heat sink for power module according to a thirteenth embodiment.

In a heat sink for power module according to the thirteenth embodiment, through holes 313c each serving as a guide portion illustrated in FIG. 30 are provided in the comb tooth member 312, instead of the recesses 312c of the comb tooth member 312 of the heat sink 12 for power module according to the twelfth embodiment. The other portions of the thirteenth embodiment are configured identically to the corresponding portions of the heat sink 12 for power module according to the tenth embodiment. Description of these portions will thus be omitted herein.

Referring to FIG. 30, the through holes 313c, which are defined in each of the upright walls 312b of the comb tooth member 312, are inclined at predetermined angles with respect to a direction perpendicular to each side surface of the upright wall 312b (or, the direction along the thickness of the upright wall 312b). Thus, while flowing in the refrigerant passage 10d, the cooling medium moves from the vicinity of one of the upright walls 312b to the vicinity of another upright wall 312b through the through holes 313c. In other words, the cooling medium flows between two areas in the refrigerant passage 10d that are separated from each other by each upright wall 312b through the through holes 313c. The through holes 313c of each upright wall 312b thus operate to stir the cooling medium flowing between the upright wall 312b and the adjacent one of the upright walls 312b.

In the heat sink for power module according to the thirteenth embodiment, the cooling medium is stirred by the guide portions defined by the through holes 313c when flowing between each adjacent pair of the upright walls 312b of the comb tooth member 312. Accordingly, the heat sink for power module according to the thirteenth embodiment has the advantages equivalent to those of the heat sinks 10 to 12 for power module according to the tenth to twelfth embodiments.

Fourteenth Embodiment

A fourteenth embodiment corresponds to the fifth invention.

Figure 31:
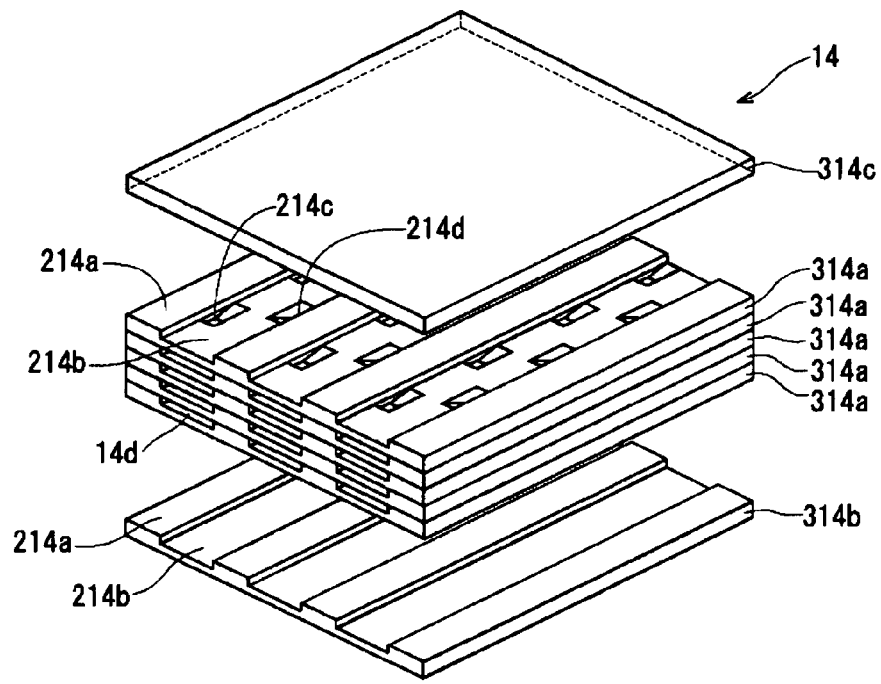
FIG. 31 is a perspective view schematically showing a heat sink for power module according to a fourteenth embodiment.
Figure 32:
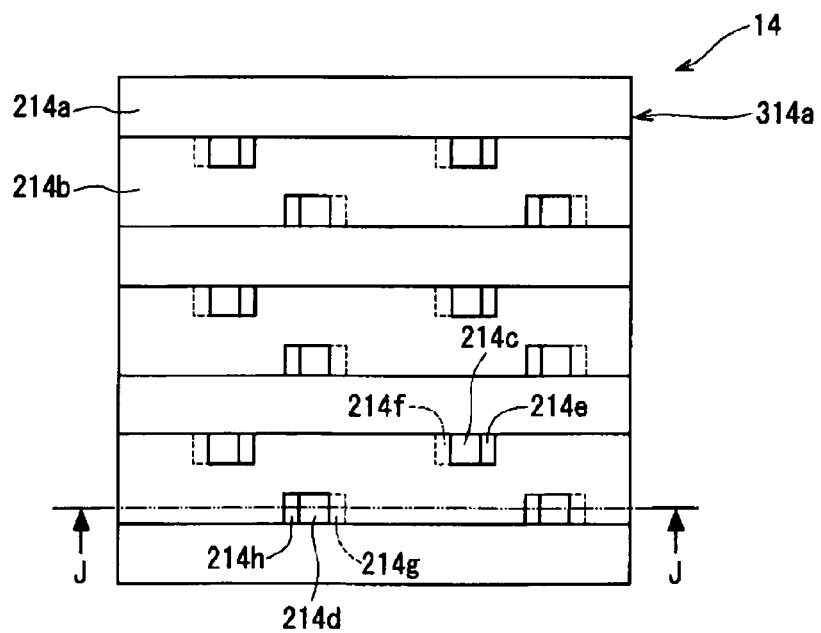
FIG. 32 is a top view schematically showing a passage plate of the heat sink for power module according to the fourteenth embodiment.
Figure 33:
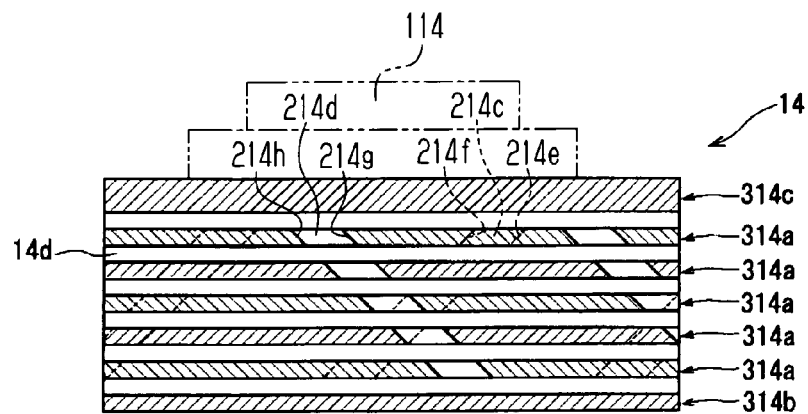
FIG. 33 is a schematic cross-sectional view taken along line J-J of FIG. 32.

As shown in FIGS. 31, 32, and 33, a heat sink 14 for power module according to the fourteenth embodiment includes a laminated body having first passage plates 314a, a second passage plate 314b, and a third passage plate 314c that are joined together. The first to third passage plates 314a, 314b, 314c are each formed of aluminum alloy. The third passage plate 314c, which is the uppermost layer, is simply a flat plate. The second passage plate 314b, or the lowermost layer, and each of the first passage plates 314a, which forms the intermediate layer, have a joint surface 214a in which parallel grooves 214b are defined. Each of the grooves 214b functions as a refrigerant passage 14d in which cooling medium for dissipating heat generated by a power device 114 (see FIG. 33) flows. First through holes 214c and second through holes 214d, which serve as guide portions operating to stir the cooling medium flowing in the corresponding one of the grooves 241b, are defined in each of the first passage plates 314a in correspondence with the grooves 214d.

With reference to FIGS. 31 to 33, the four side surfaces defining each of the first through holes 214c include two side surfaces 214e, 214f, which are adjacently arranged in the flow direction of the cooling medium. The four side surfaces defining each of the second through holes 214d include two side surfaces 214g, 214h, which are adjacently arranged in the flow direction of the cooling medium. The side surfaces 214e, 214f and the side surfaces 214g, 214h are inclined in opposite directions with respect to the flow direction of the cooling medium.

The joint surfaces 214a of the first to third passage plates 314a, 314b, 314c are joined together to close the grooves 214b of the first passage plates 314a and the second passage plate 314b. In this manner, the refrigerant passages 14d are defined. The joint surfaces 214a of the first to third passage plates 314a, 314b, 314c are joined together through, for example, brazing.

In the heat sink 14 for power module according to the fourteenth embodiment, the cooling medium flowing in the refrigerant passages 14d defined by the grooves 214b is stirred through the first and second through holes 214c, 214d. This makes it easy for the cooling medium to flow between an area thermally close to the power device 114 and an area thermally far from the power device 114. Nonuniform distribution of the temperature of the cooling medium in each of the refrigerant passages 14d is thus suppressed and the cooling medium effectively performs cooling. The heat dissipating efficiency is thus improved. As a result, the heat sink 14 for power module effectively transmits heat from the inner surfaces of the refrigerant passages 14d and the surfaces of the first to third passage plates 314a, 314b, 314c to the cooling medium.

Accordingly, the heat sink 14 for power module according to the fourteenth embodiment further improves the heat dissipating performance.

Further, in the heat sink 14 for power module according to the fourteenth embodiment, the two side surfaces 214e, 214f of each first through hole 214c and the two side surfaces 214g, 214h of each second through hole 214d are inclined in the opposite directions with respect to the flow direction of the cooling medium. This allows the cooling medium to flow among the different grooves 214b while being guided by the first through holes 214c and the second through holes 214d. More specifically, each first through hole 214c guides the cooling medium from one of each adjacent pair of the refrigerant passages 14d to the other. Each second through hole 214d guides the cooling medium in the opposite direction, or from the latter refrigerant passage 14d to the former refrigerant passage 14d. This makes it easy for the heat sink 14 for power module to rotate the cooling medium, which further reliably improves the heat dissipating performance.

Fifteenth Embodiment

A fifteenth embodiment also corresponds to the fifth invention.

A heat sink 15 for power module according to the fifteenth embodiment will now be explained mainly with regard to the differences between the heat sink 15 and the heat sink 14 for power module according to the fourteenth embodiment.

Figure 34:
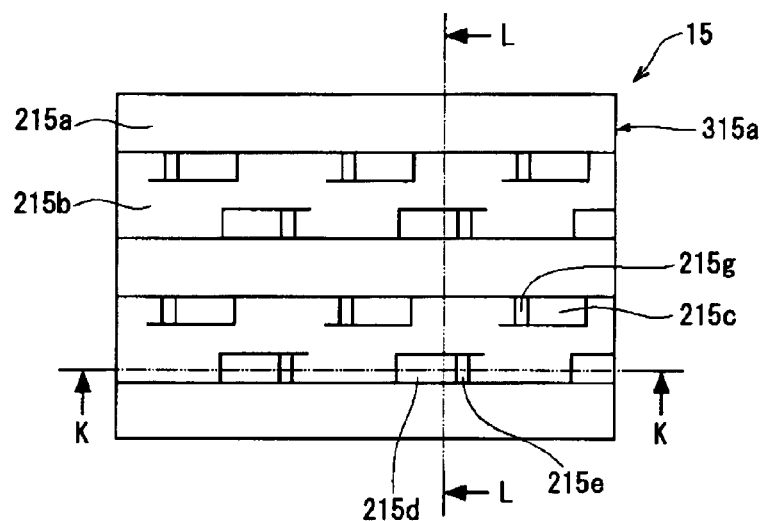
FIG. 34 is a top view schematically showing a passage plate of a heat sink for power module according to a fifteenth embodiment.
Figure 35:
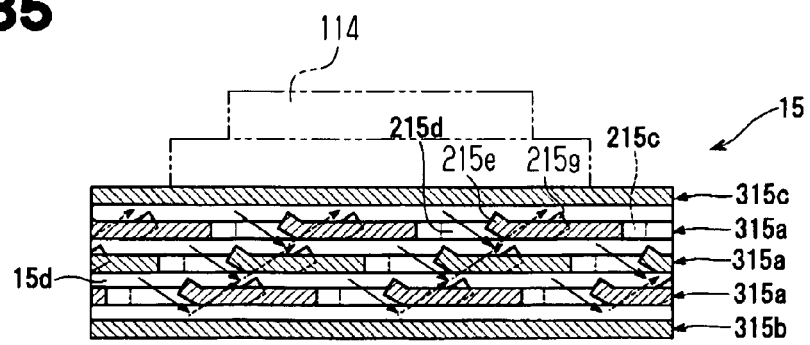
FIG. 35 is a schematic cross-sectional view taken along line K-K of FIG. 34.
Figure 36:
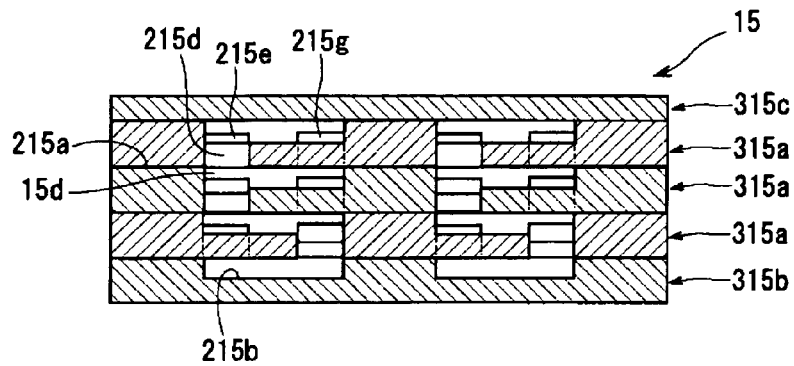
FIG. 36 is a schematic cross-sectional view taken along line L-L of FIG. 34.

As shown in FIGS. 34, 35, and 36, the heat sink 15 for power module according to the fifteenth embodiment includes a laminated body having first passage plates 315a, a second passage plate 315b, and a third passage plate 315c that are joined together. The first to third passage plates 315a, 315b, 315c are each formed of aluminum alloy. The third passage plate 315c, which is the uppermost layer, is simply a flat plate. The second passage plate 315b, or the lowermost layer, and each of the first passage plates 315a, which forms an intermediate layer, have a joint surface 215a in which parallel grooves 215b are defined. Each of the grooves 215b functions as a refrigerant passage 15d in which cooling medium for dissipating heat generated by the power device 114 flows. First through holes 215c and second through holes 215d, which serve as guide portions operating to stir the cooling medium flowing in the corresponding one of the grooves 215b, are defined in each of the first passage plates 315a in correspondence with the grooves 215d.

First projections 215e project from each of the first passage plates 315a in correspondence with the first through holes 215c. Further, second projections 215g project from each first passage plate 315a in correspondence with the second through holes 215d. Each of the first projections 215e and each of the second projections 215g are defined through bending of corresponding portions of the first passage plate 315a each of which is defined by a cut. In this manner, the first projections 215e and the second projections 215g project into the corresponding grooves 215b. The first projections 215e and the second projections 215g are inclined in opposite directions with respect to the flow direction of the cooling medium.

The joint surfaces 215a of the first, the second, and the third passage plates 315a, 315b, 315c are joined together to close the grooves 215b of the first passage plates 315a and the second passage plate 315b, thus defining refrigerant passages 15d.

In the heat sink 15 for power module according to the fifteenth embodiment, which is configured as above-described, the cooling medium flowing in the refrigerant passages 15d defined by the grooves 215b is stirred by not only the first and second through holes 215c, 215d but also the first and second projections 215e, 215g. The heat sink 15 for power module according to the fifteenth embodiment further reliably brings about the advantages equivalent to those of the heat sink 14 for power module according to the fourteenth embodiment.

Sixteenth Embodiment

A sixteenth embodiment also corresponds to the fifth invention.

A heat sink 16 for power module according to the sixteenth embodiment will now be explained mainly with regard to the differences between the heat sink 16 and the heat sink 14 for power module according to the fifteenth embodiment.

Figure 37:
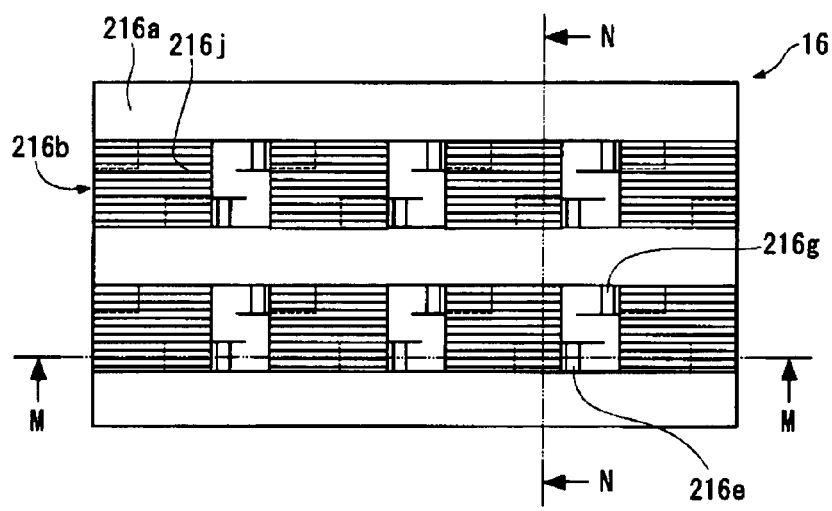
FIG. 37 is a top view schematically showing a passage plate of a heat sink for power module according to a sixteenth embodiment.
Figure 38:
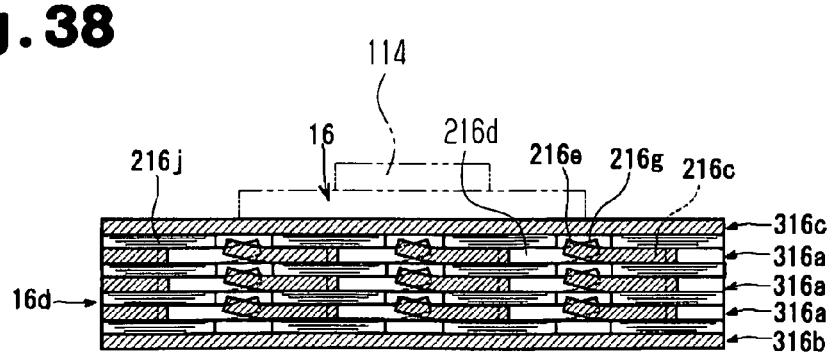
FIG. 38 is a schematic cross-sectional view taken along line M-M of FIG. 37.
Figure 39:
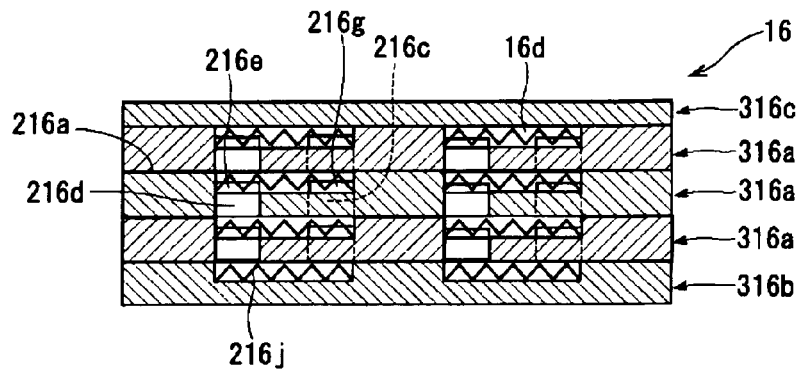
FIG. 39 is a schematic cross-sectional view taken along line N-N of FIG. 37.

As shown in FIGS. 37, 38, and 39, the heat sink 16 for power module according to the sixteenth embodiment includes a laminated body having first passage plates 316a, a second passage plate 316b, and a third passage plate 316c that are joined together. The first to third passage plates 316a, 316b, 316c are each formed of aluminum alloy. The third passage plate 316c, which is the uppermost layer, is simply a flat plate. The second passage plate 316b, or the lowermost layer, and each of the first passage plates 316a, which forms an intermediate layer, have a joint surface 216a in which parallel grooves 216b are defined. Each of the grooves 216b functions as a refrigerant passage 16d in which cooling medium for dissipating heat generated by the power device 114 flows.

In each of the grooves 216b, corrugated fin bodies 216j are aligned along the flow direction of the cooling medium. Each of the corrugated fin bodies 216j is formed through bending of a thin aluminum plate.

First through holes 216c and second through holes 216d, which form guide portions that operate to stir the cooling medium flowing in the corresponding grooves 216b, are defined in each of the first passage plates 316a in correspondence with the grooves 216b. Also, each of the first through holes 216c and each of the second through holes 216d are provided between the corresponding adjacent pair of the corrugated fin bodies 216j.

First projections 216e project from each of the first passage plates 316a in correspondence with the first through holes 216c. Further, second projections 216g project from each first passage plate 316a in correspondence with the second through holes 216d. Each of the first projections 216e and each of the second projections 216g are defined through bending of corresponding portions of the corresponding first passage plate 316a each of which is defined by a cut. In this manner, the first projections 216e and the second projections 216g project into the corresponding grooves 216b. The first projections 216e and the second projections 216g are inclined in opposite directions with respect to the flow direction of the cooling medium.

In the heat sink 16 for power module according to the sixteenth embodiment, which is configured as above-described, the corrugated fin bodies 216j greatly increase the contact area with respect to the cooling medium. This increases the amount of the heat transmitted to the cooling medium flowing in the refrigerant passages 16d. Further, the cooling medium proceeds along the corrugated fin bodies 216j in the refrigerant passages 16d while being stirred by not only the first and second through holes 216c, 216d but also the first and second projections 216e, 216g. As a result, the heat sink 16 for power module according to the sixteenth embodiment further reliably brings about the advantages equivalent to those of the heat sinks 14, 15 for power module according to the fourteenth and fifteenth embodiments.

Seventeenth Embodiment

A seventeenth embodiment corresponds to the sixth invention.

With reference to FIGS. 40, 41, 42, and 43, power devices 95 may be mounted on a surface of a heat sink 17 for power module according to the seventeenth embodiment. The heat sink 17 has a refrigerant passage 17d in which cooling medium for dissipating heat generated by the power devices 95 flows. A supply pipe 96, which supplies the cooling medium, is connected to an end of the heat sink 17 for power module.

The refrigerant passage 17d of the heat sink 17 for power module is a space with a rectangular cross section surrounded by a surface 17b, a backside 17c, and side surfaces 17e, which are provided at opposing sides. The cooling medium, which is supplied from the supply pipe 96 to the refrigerant passage 17d, flows in the refrigerant passage 17d from the left side toward the right side, as viewed in FIGS. 40, 41, and 43.

Comb tooth members 317 are arranged in the refrigerant passage 17d and aligned along the flow direction of the cooling medium. Each of the comb tooth members 317 is formed of an aluminum extrusion. Each comb tooth member 317 has a substrate 317a extending parallel with the surface on which the power devices 95 are arranged and upright walls 317b projecting from the substrate 317a in a direction crossing the surface on which the power devices 95 are provided. Each of the upright walls 317b extends in the flow direction of the cooling medium in the refrigerant passage 17d.

Figure 40:
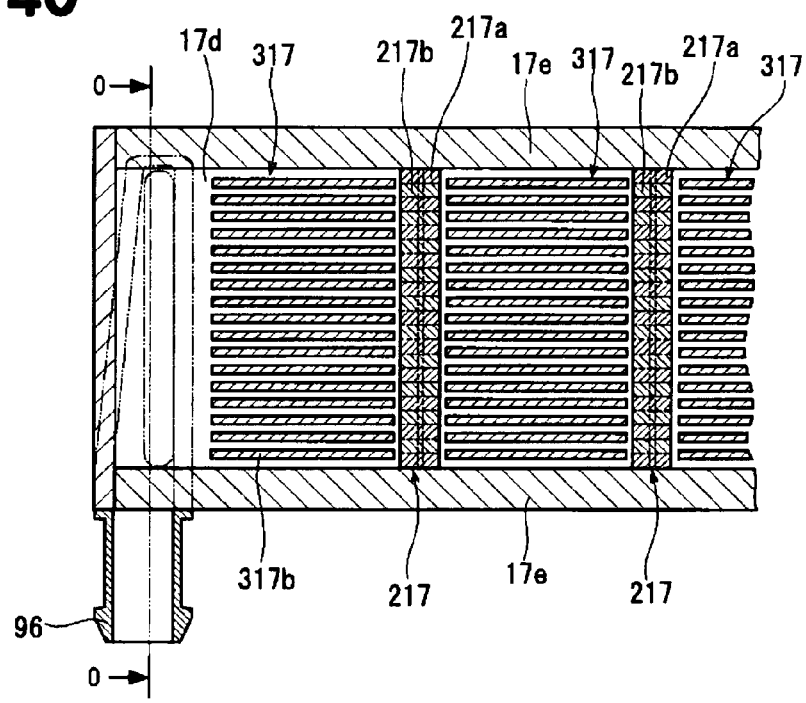
FIG. 40 is a top view schematically showing a heat sink for power module according to a seventeenth embodiment.
Figure 41:
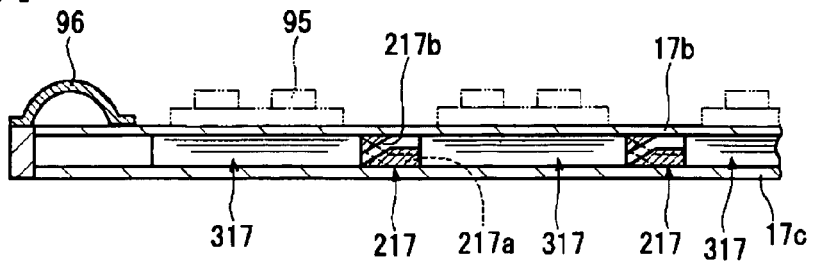
FIG. 41 is a side view schematically showing the heat sink for power module according to the seventeenth embodiment.
Figure 42:
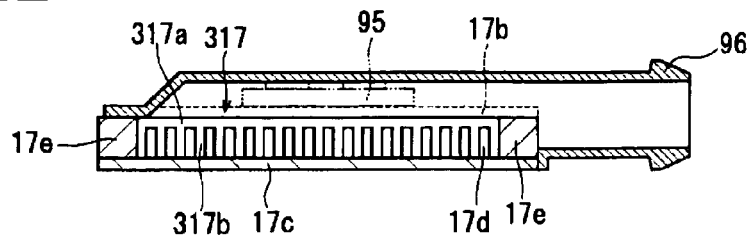
FIG. 42 is a schematic cross-sectional view taken along line O-O of FIG. 40.
Figure 43:
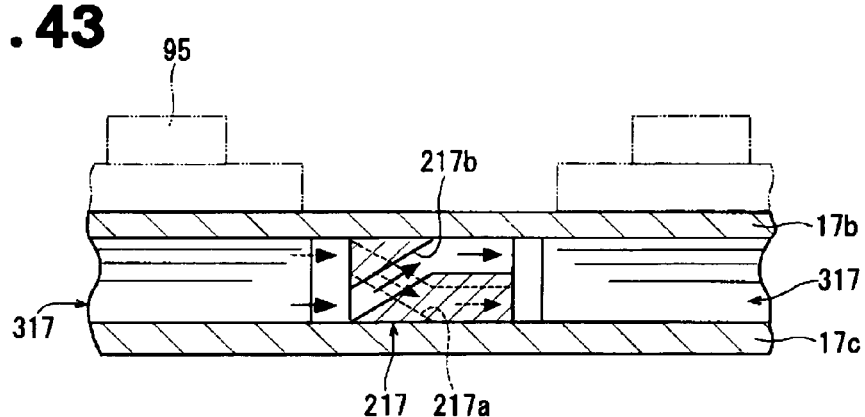
FIG. 43 is an enlarged cross-sectional view showing a main portion of the heat sink for power module according to the seventeenth embodiment.

An exchange device 217 is provided between each adjacent pair of the comb tooth members 317. Referring to FIGS. 40 and 43, a first passage 217a and a second passage 217b are defined in each of the exchange devices 217. The first passages 217a and the second passages 217b are arranged alternately in the direction along the width of the refrigerant passage 17d (the direction perpendicular to the flow direction of the cooling medium). Each of the first passages 217a operates to move the cooling medium from the side corresponding to the surface to the side corresponding to the backside in the refrigerant passage 17. In other words, each first passage 217a operates to move the cooling medium from an area in the refrigerant passage 17d close to the surface on which the power devices 95 are located to an area in the refrigerant passage 17d far from this surface. Each of the second passages 217b operates to move the cooling medium from the side corresponding to the backside to the side corresponding to the surface in the refrigerant passage 17. That is, each second passage 217b operates to move the cooling medium from the area in the refrigerant passage 17d far from the surface on which the power devices 95 are mounted to the area in the refrigerant passage 17d close to this surface.

The exchange devices 217 are manufactured using the following manufacturing method.

Figure 44:
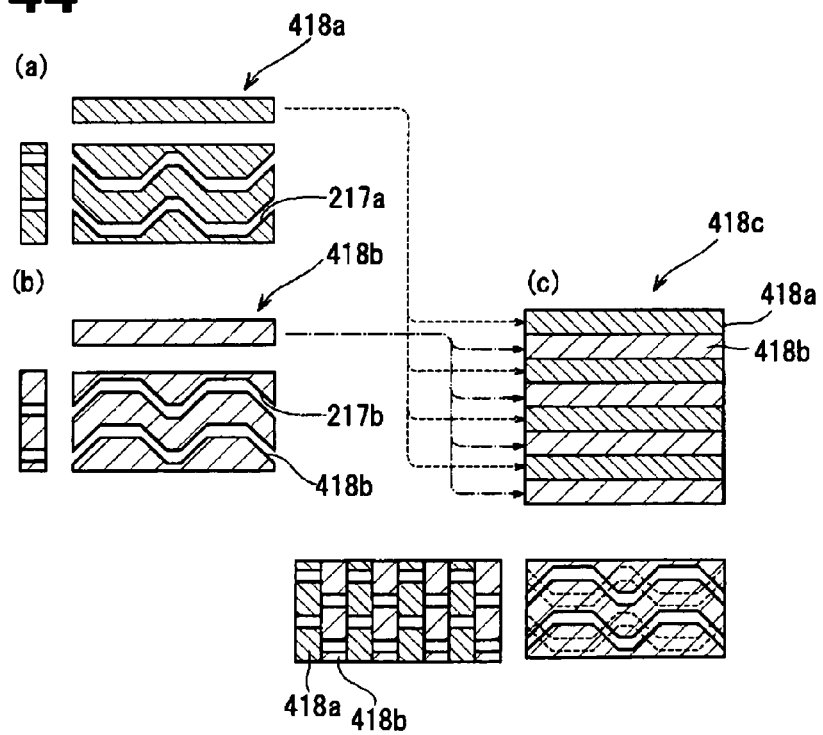
FIG. 44(a) is a set of three views (a front view, a plan view, and a side view) showing a first plate of the heat sink for power module according to the seventeenth embodiment.
FIG. 44(b) is a set of three views showing a second plate of the heat sink for power module according to the seventeenth embodiment.
FIG. 44(c) is a set of three views showing a laminated body of the heat sink for power module according to the seventeenth embodiment.
Figure 45:
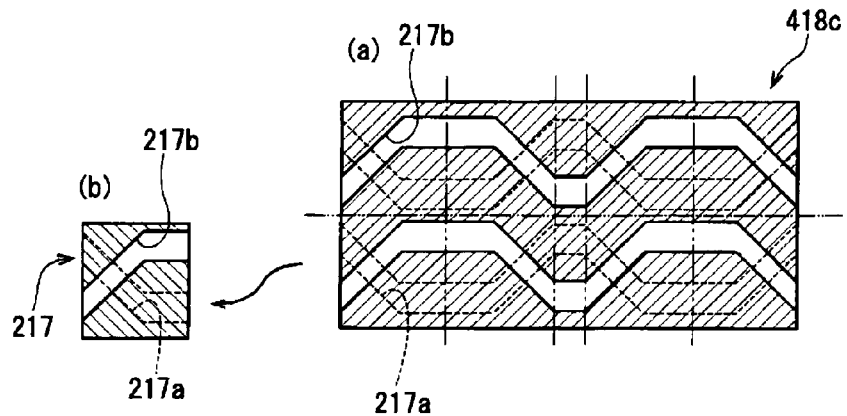
FIG. 45(a) is a side view showing the laminated body of the heat sink for power module according to the seventeenth embodiment.
FIG. 45(b) is a side view showing an exchange device obtained by cutting the laminated body of FIG. 45(a).

Specifically, as illustrated in FIGS. 44(a), 44(b), and 44(c), first plates 418a formed of aluminum alloy in which the first passages 217a are defined and second plates 418b formed of aluminum alloy in which the second passages 217b are defined are alternately laminated in the direction along the width of the refrigerant passage 17d to form a laminated body 418c. Next, as illustrated in FIGS. 45(a) and 45(b), the laminated body 418c is cut to provide the exchange devices 217. The manufacturing method decreases the costs for manufacturing the heat sink 17 for power module according to the seventeenth embodiment.

The heat sink 17 for power module according to the seventeenth embodiment also forms a power module when the power devices 95 are mounted on the surface of the heat sink 17.

In the heat sink 17 for power module according to the seventeenth embodiment, the exchange devices 217 in the refrigerant passage 17d operate to move the cooling medium from the side corresponding to the surface to the side corresponding to the backside and from the surface to the side corresponding to the backside to the side corresponding to the surface. Thus, the cooling medium easily flows between an area thermally close to the power devices 95 and an area thermally far from the power devices 95. This suppresses nonuniform distribution of the temperature of the cooling medium in the refrigerant passage 17d, allowing the cooling medium to effectively perform cooling. The heat dissipating efficiency is thus improved. As a result, the heat sink 17 for power module effectively transmits heat from the inner surfaces of the refrigerant passage 17d to the cooling medium.

Accordingly, the heat sink 17 for power module according to the seventeenth embodiment further improves the heat dissipating performance.

Eighteenth Embodiment

An eighteenth embodiment also corresponds to the sixth invention.

Figure 46:
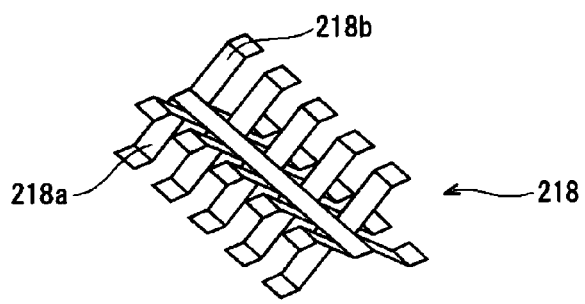
FIG. 46 is a perspective view schematically showing an exchange device of a heat sink for power module according to an eighteenth embodiment.

In a heat sink for power module according to the eighteenth embodiment, exchange devices 418 illustrated in FIG. 46 are provided in the refrigerant passage 17d, instead of the exchange devices 217 of the heat sink 17 for power module according to the seventeenth embodiment. The other portions of the eighteenth embodiment are configured identically to the corresponding portions of the heat sink 17 for power module according to the seventeenth embodiment. Description of these portions will thus be omitted herein.

Referring to FIG. 46, to form the exchange devices 218, cuts are provided in the opposing long sides of a thin metal plate having an elongated shape. Then, each adjacent pairs of cut pieces 218a of one of the long sides are bent to be inclined at an inclination angle in opposite directions. Afterwards, cut pieces 218b of the other long side are bent to be inclined at the inclination angle in opposite directions to those of the opposing cut pieces 218a. The manufacturing method decreases the costs for manufacturing the heat sink for power module according to the eighteenth embodiment.

In the heat sink for power module having such exchange devices 218 according to the eighteenth embodiment, the exchange devices 218 operate to move the cooling medium from the side corresponding to the surface to the side corresponding to the backside and from the side corresponding to the backside to the side corresponding to the surface. Thus, the heat sink for power module according to the eighteenth embodiment has the advantages equivalent to those of the heat sink 17 for power module according to the seventeenth embodiment.

Nineteenth Embodiment

A nineteenth embodiment corresponds to the sixth invention.

Figure 47:
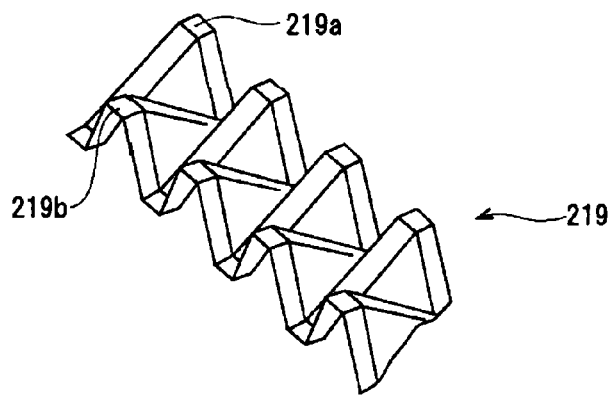
FIG. 47 is a perspective view schematically showing an exchange device of a heat sink for power module according to a nineteenth embodiment.

In a heat sink for power module according to the nineteenth embodiment, exchange devices 219 illustrated in FIG. 47 are provided in the refrigerant passage 17d, instead of the exchange devices 217 of the heat sink 17 for power module according to the seventeenth embodiment. The other portions of the nineteenth embodiment are configured identically to the corresponding portions of the heat sink 17 for power module according to the seventeenth embodiment. Description of these portions will thus be omitted herein.

Referring to FIG. 47, first projections 219a and second projections 219b, which are inclined in opposite directions, are formed alternately in each of the exchange devices 219. Each exchange device 219 is formed through pressing of an belt-like metal plate. The manufacturing method reduces the costs for manufacturing the heat sink for power module according to the eighteenth embodiment.

In the heat sink for power module having such exchange devices 219 according to the nineteenth embodiment, the exchange devices 219 operate to move the cooling medium from the side corresponding to the surface to the side corresponding to the backside and the side corresponding to the backside to the side corresponding to the surface. Thus, the heat sink for power module according to the nineteenth embodiment has the advantages equivalent to those of the heat sink 17 for power module according to the seventeenth embodiment.

Although the first to nineteenth embodiments of the present invention have been described so far, the invention is not restricted to these embodiments and may be modified as desired without departing from the scope of the invention.

The invention claimed is:

1. A power module comprising:
a power device; and
a heat sink to which heat generated by the power device is transmitted, the heat sink including:
   a refrigerant passage in which a cooling medium that dissipates the heat generated by the power device flows, the refrigerant passage is defined by a surface and a backside, and the power device is disposed in proximity to said surface; and
a corrugated fin body arranged in the refrigerant passage,
   wherein the corrugated fin body has crests and troughs that extend in a parallel manner and side walls each of which connects a corresponding one of the crests with an adjacent one of the troughs, the crests are joined to the surface, and the troughs are joined to the backside, wherein each adjacent pair of the side walls and the corresponding one of the crests or the adjacent one of the troughs arranged between the each adjacent pair of side walls form a fin,
   wherein a first louver is formed in one of the each adjacent pair of the side walls, a second louver is formed in another of the each adjacent pair of the side walls, and wherein the first and second louvers operate to, at least, rotate the cooling medium flowing in the fin to the other side wall past the corresponding one of the crests or the adjacent one of the troughs.

2. The power module according to claim 1, wherein the first louver and the second louver are inclined in opposite directions with respect to a direction in which the crests and the troughs extend along the surface and the backside of the refrigerant passage.

3. The power module according to claim 1, wherein each of the first and second louvers is formed through bending of a portion of a corresponding one of the side walls defined by a cut.

4. The power module according to claim 3, wherein the first louver louvers is two first louvers formed in the one of the each adjacent pair of the side walls,
   wherein the second louver is two second louvers formed in the another of the each adjacent pair of the side walls; and wherein the two first or second louvers formed in each of the side walls are located at different positions in a direction along a height of a wave formed by the corrugated fin body, the height being defined in a direction between the surface and the backside of the refrigerant passage, and the two first or second louvers are formed through bending of portions of the side wall defined by cuts in opposite directions.

5. The power module according to claim 1, wherein the first louvers and the second louvers are inclined in the same direction with respect to a direction in which the crests and the troughs extend along the surface and the backside of the refrigerant passage, and wherein through holes are formed at positions corresponding to both ends of each side wall in the direction along a height of the side wall.

6. The power module according to claim 1, wherein a wave formed by the corrugated fin body has a rectangular shape.

* * * * *